United States Patent
Ayranci et al.

(10) Patent No.: US 10,326,484 B1
(45) Date of Patent: Jun. 18, 2019

(54) RECONFIGURABLE CARRIER AGGREGATION FECC WITH SWITCHED FILTERS AND PROGRAMMABLE BAND SWITCHING LNA

(71) Applicant: pSemi Corporation, San Diego, CA (US)

(72) Inventors: Emre Ayranci, Costa Mesa, CA (US); Miles Sanner, San Diego, CA (US); Phanindra Yerramilli, San Diego, CA (US); Kashish Pal, Reading (GB)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 16/001,871

(22) Filed: Jun. 6, 2018

(51) Int. Cl.
*H04B 1/16* (2006.01)
*H03F 3/19* (2006.01)

(52) U.S. Cl.
CPC ............. *H04B 1/1638* (2013.01); *H03F 3/19* (2013.01); *H03F 2200/165* (2013.01); *H03F 2200/294* (2013.01); *H03F 2200/451* (2013.01)

(58) Field of Classification Search
CPC ... H04B 1/1638; H03F 3/19; H03F 2200/165; H03F 2200/294; H03F 2200/451
See application file for complete search history.

(56) References Cited

U.S. PATENT DOCUMENTS

| | | | | |
|---|---|---|---|---|
| 9,941,849 B1* | 4/2018 | Ayranci | ............ | H03H 7/38 |
| 2008/0310456 A1* | 12/2008 | Bauwelinck | ............ | H04B 3/54 |
| | | | | 370/488 |
| 2011/0003563 A1* | 1/2011 | Gorbachov | ........ | H01Q 21/0025 |
| | | | | 455/78 |
| 2013/0244722 A1* | 9/2013 | Rousu | ............ | H04B 1/16 |
| | | | | 455/552.1 |
| 2015/0304059 A1* | 10/2015 | Zuo | ............ | H04J 1/08 |
| | | | | 370/343 |
| 2015/0349724 A1* | 12/2015 | Wang | ............ | H03F 1/32 |
| | | | | 330/285 |
| 2016/0087587 A1* | 3/2016 | Wang | ............ | H03F 1/56 |
| | | | | 330/295 |
| 2017/0048859 A1* | 2/2017 | Hayakawa | ............ | H01Q 1/48 |
| 2017/0093374 A1* | 3/2017 | Yatsenko | ............ | H03H 9/542 |
| 2017/0094607 A1* | 3/2017 | Ripley | ............ | H04W 52/04 |
| 2017/0332280 A1* | 11/2017 | Kuroda | ............ | H04W 28/16 |
| 2018/0019710 A1* | 1/2018 | Ayranci | ............ | H03F 1/0277 |
| 2018/0351520 A1* | 12/2018 | Ayranci | ............ | H03F 3/195 |

* cited by examiner

*Primary Examiner* — Dominic E Rego
(74) *Attorney, Agent, or Firm* — Jaquez Land Greenhaus LLP; Bruce W. Greenhaus, Esq.

(57) ABSTRACT

A front end module having reduced number of low noise amplifier (LNAs) for receiving various combinations of contiguous aggregation (CA) signals and non-CA signals having different combinations of signals aggregated therein. The FECC can include a broadband LNA and/or a band-switching LNA having at least two modes of operation. An input switch directs a received signal to one of several banks of filters. LNA switches direct the signals from the output of filters within a selected filter bank to particular LNAs. LNAs may be connected by LNA switches to filters in more than one filter bank. The proper mode of operation is selected for the band switching LNA based on the particular frequencies present in the received signal and the filters selected.

13 Claims, 15 Drawing Sheets

TABLE 1

| Line | SFR1 signals | SFR2 signals | SFR3 signals | SFR4 signals | Input Sw. 104 | SFR1 Sw. 116 | SFR2/SFR4 Sw. 209 | SFR3/SFR4 Sw. 210 | SFR1 LNA 124 | SFR2/SFR4 LNA 208 | SFR3/SFR4 LNA 212 |
|---|---|---|---|---|---|---|---|---|---|---|---|
| 1 | X | X | X |   | Filter Bank 106 | Filter 110 | Filter 112 | Filter 114 | ON | SFR2 Mode | ON |
| 2 | X | X |   |   | Filter Bank 106 | Filter 110 | Filter 112 | Term | ON | SFR2 Mode | OFF |
| 3 | X |   | X |   | Filter Bank 106 | Filter 110 | Term | Filter 114 | ON | OFF | ON |
| 4 |   | X | X |   | Filter Bank 106 | Term | Filter 112 | Filter 114 | OFF | SFR2 Mode | ON |
| 5 |   | X |   |   | Filter Bank 106 | Term | Filter 112 | Term | OFF | SFR2 Mode | OFF |
| 6 |   |   | X |   | Filter Bank 106 | Term | Term | Filter 114 | OFF | OFF | ON |
| 7 | X |   |   | X | Filter Bank 108 | Filter 129 | Term | Term | ON | OFF | OFF |
| 8 | X |   | X | X | Filter Bank 108 | Filter 129 | Filter 132 | Filter 130 | ON | OFF | ON |
| 9 | X |   |   | X | Filter Bank 108 | Filter 129 | Filter 132 | Filter 130 | ON | SFR4 Mode | ON |
| 10 |   |   | X |   | Filter Bank 108 | Term | Filter 132 | Filter 130 | OFF | SFR4 Mode | ON |
| 11 |   |   |   | X | Filter Bank 108 | Term | Term | Filter 132 | OFF | OFF | ON |

FIG. 3

RECONFIGURABLE CARRIER AGGREGATION FECC WITH SWITCHED FILTERS AND PROGRAMMABLE BAND SWITCHING LNA

BACKGROUND

(1) Technical Field

Various embodiments described herein relate to RF front ends and more particularly to low noise amplifiers for use in communications equipment configured for receiving carrier aggregation signals.

(2) Background

Many modern electronic systems include radio frequency (RF) transceivers; examples include personal computers, wireless tablets, cellular telephones, wireless network components, televisions, cable system "set top" boxes, radar systems, etc. In communication systems, radio frequencies are separated into frequency bands. Bands are assigned a particular frequency range. For example, the IEEE (Institute of Electrical and Electronics Engineers) defines the following bands:

| | | |
|---|---|---|
| HF | 0.003 TO 0.03 GHz | HIGH FREQUENCY |
| VHF | 0.03 TO 0.3 GHz | VERY HIGH FREQUENCY |
| UHF | 0.3 TO 1 GHz | ULTRA HIGH FREQUENCY |
| L | 1 TO 2 GHz | LONG WAVE |
| S | 2 TO 4 GHz | SHORT WAVE |
| C | 4 TO 8 GHz | COMPROMISE BETWEEN S AND X |
| X | 8 TO 12 GHz | USED IN WW II FOR FIRE CONTROL, X FOR CROSS (AS IN CROSSHAIR). EXOTIC. |
| $K_U$ | 12 TO 18 GHz | KURZ-UNDER |
| K | 18 TO 27 GHz | KURZ (GERMAN FOR "SHORT") |
| $K_A$ | 27 TO 40 GHz | KURZ-ABOVE |
| V | 40 TO 75 GHz | |
| W | 75 TO 110 GHz | W FOLLOWS V IN THE ALPHABET |
| MM OR G | 110 TO 300 GHz [NOTE 1] | MILLIMETER |

For maximum compatibility in North American 2G/3G/4G, cellular phones are typically capable of handling dual-band 800 MHz Cellular or 1900 MHz PCS. In many markets 4G data (LTE, WiMAX) is modulated on signals operating at frequencies of 700 MHz, 1700-2100 MHz, 1900 MHz and 2500-2700 MHz. In many cases, channels are assigned to a narrower range of frequencies within each band. Typically, RF signals to be transmitted are modulated within one of the channels of a selected band. The front end of a communications receiver within any such transceiver typically includes an LNA that is responsible for providing the first stage amplification to a signal received within the communications receiver. The sensitivity of a receiver is, in large part, determined by the quality of the front end and in particular, by the quality of the LNA. The receivers in some cellular telephones in use today have the ability to receive signals in several different bands. An LNA may be dedicated to each such band or portion of a band. Alternatively, since signals in only certain frequency bands need to be received at any one time, the number of LNAs and thus the size and cost of the receiver can be reduced by allowing the outputs of different filters to be selectively coupled to the specific LNAs that can amplify signals in all of the desired bands. In some cases, the LNA is selectively optimized for one selected frequency range at a time.

However, as the desire grows for more information to be sent in a shorter period of time, several channels can be grouped together to form a signal operating within a supported frequency range. Grouping channels together increases the information throughput between a transmitting and receiving device. In addition, it is common today for receivers in a transceiver, such as a cellular telephone, to have the capability to concurrently receive signals transmitted over multiple supported frequency ranges. The signals within each supported frequency range are combined (or "aggregated") to be transmitted together at the same time to the receiver. In addition, an entity that desires to send a variable number of streams of information with the flexibility to determine the particular number of channels over which each stream is to be transmitted can use aggregated signals to create flexible broadband multi-channel transmissions. Signals having contiguous supported frequency ranges can be aggregated. Alternatively, signals that have non-contiguous supported frequency ranges can be aggregated. A signal in which non-contiguous supported frequency ranges are from the same band (e.g., Cellular band) is commonly referred to as intraband non-contiguous carrier aggregation (CA) signal. Alternatively, a signal in which non-contiguous supported frequency ranges selected from two or more bands are aggregated is commonly referred to as an interband CA signal. For example, a cellular phone may have the capability to receive a interband CA signal having one or more supported frequency ranges that include channels within the 800 MHz Cellular band, aggregated with one or more other supported frequency ranges that include channels within the 1900 PCS band.

While aggregating signal having different supported frequency ranges provides benefits in terms of bandwidth, it requires that the transmitters and receivers be capable of handling signals from several non-contiguous frequency ranges, possibly spread over several bands (e.g., Cellular and PCS bands), at the same time. In particular, the front-end circuit configuration (FECC) of a receiver needs to be able to handle the broad frequency range that results from aggregation of interband non-contiguous CA. This typically requires an ensemble of passive filters and LNAs tuned to various different frequencies. That is, it is not effective for one LNA to receive signals over the broad range of frequencies commonly used in CA systems (i.e., systems that aggregate supported frequency ranges for transmission to a common receiver).

In a CA scenario, it is desirable to send each supported frequency range through a separate receive chain optimized for the frequency of the supported frequency range. This is primarily done to reduce the bandwidth requirements associated with the baseband processing. Each such receive chain performs a separate downconversion. A separate LNA is associated with each receive chain. Accordingly, each supported frequency range is amplified by one LNA and each of the other supported frequency range are amplified by other LNAs. Signals to be amplified by each LNA typically require some filtering prior to being amplified. Therefore, typically at least one filter is required for each LNA. Such filtering protects the LNA from the associated transceiver's own transmit signal, as well as the numerous interferers that may be present in various other frequency bands. Accordingly, the signals in each supported frequency range are filtered, amplified and sent to the associated transceiver. The transceiver typically tunes to the channels within the desired supported frequency range and conducts further downconversion and filtering. By using several LNAs responsible for providing the first stage amplification to a signal received within the communications receiver, each LNA can be optimized to receive a relatively small frequency range from among the broader frequency range of the CA signal. In some such cases, the range may be as narrow as a single supported frequency range. However, the range may include several supported frequency ranges. By optimizing different LNAs to receive signals transmitted over different supported frequency ranges, each LNA can be optimized to amplify signals at frequencies that lie at frequencies of interest. Such amplifiers are optimized to have better RF performance (as measured by gain, noise figure, third-order intercept point, etc.), making it possible to produce more sensitive receivers at a lower cost. One way in which the LNAs can be optimized is by using switches that can be configured through software to alter the components of the LNA.

In some cases the current state of the art requires four LNAs to receive CA signals having combinations of any three of four supported frequency ranges (SFRs); SFR1, SFR2, SFR3 and SFR4, depending upon the frequency of each of the SFRs. For Example, FIG. 1A is a simplified schematic of the FECC 100 of a receiver designed to receive CA signals having specific CA combinations of three of the four SFRs. The CA signal has information that is modulated on several channels in different SFRs. In the example shown in FIG. 1A, the frequency range of SFR1 is 824-849 MHz, the frequency range of SFR 2 is 1805-1880, the frequency range of SFR3 is 2.62 GHz to 2.69 GHz, and the frequency range of SFR4 is 2.3 GHz to 2.4 GHz. To receive the combinations shown requires four LNAs.

Signals are received by an antenna 102 coupled to a single-pole/N-throw (SPNT) input switch 104. The input switch 104 allows the signal to be routed to one of several banks of filters 106, 108. The filters within each bank of filters 106, 108 are selected to support the reception of a particular combination of supported frequency ranges that are aggregated together by the transmitter. For example, the first bank of filters 106 includes an SFR1 filter 110 tuned to receive SFR1 signals, an SFR2 filter 112 tuned to receive SFR2 signals and an SFR3 filter 114 tuned to receive SFR3 signals. When the input switch 104 is set to select the first output (i.e., output 1), the signal received by the antenna 102 is coupled through the input switch 104 to the first filter bank 106.

The SFR1 filter 110 outputs an SFR1 signal 111. The SFR1 signal 111 is coupled to an SFR1 switch 116. The SFR1 switch 116 is an SPNT switch that selects from among several possible SFR1 signals 111, 118, two of which are expressly shown. The SFR2 filter 112 outputs an SFR2 signal to an SFR2 switch 120. The SFR2 switch 120 is another SPNT switch. The SFR2 switch 120 selects an SFR2 signal from among several SFR2 signals (only one is shown for the sake of simplicity). The SFR3 filter 114 outputs an SFR3 signal to an SFR3 SPNT switch 122. The switches 116, 120, 122 work together with the input switch 104 to ensure that when a signal having a particular aggregation of supported frequency ranges is received, the input switch 104 routes the received signal 105 to the appropriate filter bank and LNAs. For example, if a signal is received that includes an SFR1 signal, an SFR2 signal and an SFR3 signal, the input switch 104 outputs signals to the first bank of filters 106 and the switches 116, 120, 122 select the input that is coupled to the first bank of filters 106 to be routed to the LNAs. In some embodiments, one of the other inputs to the SFR1 switch 116 may be connected to an SFR1 filter 113 that is tuned to SFR1. The input of such a filter 113 could be coupled to a dedicated output port of the input switch 104. The output of such a filter 113 is coupled to one of the other inputs of the SFR1 switch 116. Such a filter 113 could be provided for any of the SFRs and coupled between the input switch 104 and a switch 116, 120, 122 associated with that supported frequency range. Such dedicated ports may have a lower insertion loss than the ports that service a broader frequency range, but can only be used when the received signal has signals of interest that fall within the pass band of the selected dedicated filter.

The output of each switch 116, 120, 122 is coupled to an LNA 124, 126, 128 that is configured to receive the particular frequency passed by the filter 110, 112, 114. For example, the SFR1 switch 116 is coupled to an SFR1 LNA 124. A 4-to-3 output switch matrix 126 selects a maximum of three of the possible four signals to be output by the FECC 100. The switch matrix 126 is also coordinated with the input switch 104 and the other switches 116, 120, 122 to ensure that when the input switch selects a particular filter bank 106, 108 the output matrix switch 126 outputs the appropriate signals. In the example shown in FIG. 1A, each filter bank 106, 108 has three filters. All of the outputs from the FECC 100 are provided through a receive filter. Therefore, a maximum of three signals are output from the FECC 100 at any one time. However, this particular architecture is shown merely to explain the concept. It is possible to extend the concept to an FECC having more or less than three outputs.

For example, FIG. 1B is an illustration of a CA signal 150 having eleven channels 160-170. The channels 160-170 are divided into four supported frequency ranges 152, 154, 156, 158. Each supported frequency range has a number of contiguous channels. An FECC (not shown) may be capable of receiving the CA signal 150. All of the channels of the four supported frequency ranges 152, 154, 156, 158 of channels 160-170 are aggregated together. The channels 160-162 of a first supported frequency range 152 are contiguous with each other. However, they are non-contiguous with the channels 163-170 in the other supported frequency ranges 154, 156, 158 (i.e., there is at least some space between the end of one supported frequency range 152 and the beginning of the next supported frequency range 154). An FECC designed to receive the CA signal 150 may have one filter bank (not shown) associated with that particular CA signal 150. Each filter within the filter bank is tuned for the frequency of one of the supported frequency ranges 152, 154, 156, 158. The filter bank is coupled to an output (not shown) of the input switch 104. When the FECC is to receive the CA signal 150, the input switch is set to select that output. Selecting other outputs of the input switch 104 allows the FECC to receive other combinations of aggregated signals having frequencies within a set of supported frequency ranges. The number of outputs from the output switch matrix 126 will be equal to the maximum number of supported frequency ranges aggregated in the CA signals that the FECC can receive. The signals associated with each supported frequency range 152, 154, 156, 158 (i.e., each output of the filter bank) are sent to dedicated receive chains after being filtered and amplified. It should also be noted that not all filter banks have to have the same number of filters. Furthermore, not all supported frequency ranges 152, 154, 156, 158 have to have the same number of channels. Still further, some received signals may be filtered prior to being received within the FECC. The pre-filtered signal may be coupled to a designated input in the FECC. In such cases, a filter may not be required. The signal may be directed by the input switch and LNA switches to a particular LNA associated with the FECC input to which the signal is coupled without passing through a filter.

Looking again at FIG. 1A, it can be seen that when the input switch 104 selects the Nth output, the received signal 105 is routed to the filter bank 108. The filter bank 108 has an SFR1 filter 129, an SFR3 filter 130 and an SFR4 filter 132. In order for the FECC to service the outputs of both filter banks 106, 108, the FECC must have four LNAs. That is, while it is possible for one LNA to amplify both the SFR3 and SFR4 signals at the different times, it cannot do so at the same time, as required in a CA scenario in which both supported frequency ranges are aggregated in the same CA signal. Thus, the signal needs to be simultaneously sent to separate receivers. In some cases, a CA signal may aggregate supported frequency ranges comprising portions of one or more of the bands that are not contiguous (or that are too wide when taken together) and therefore require more than one filter, even though they fall within the same band. Therefore, in systems that have several different combinations of CA signals (i.e., filter banks with several different combinations of filters tuned to different supported frequency ranges) the number of LNAs can become rather large. Since LNAs and the associated circuitry necessary to operate the LNA at optimum performance can take up a lot of real estate on an FECC, the cost can become rather high if the FECC is to receive more than a relatively limited number of combinations of aggregated supported frequency ranges.

Therefore, there is currently a need for a more efficient FECC that can handle several combinations of supported frequency ranges without the need for an extensive number of LNAs.

SUMMARY OF THE INVENTION

A receiver front end circuit configuration (FECC) is disclosed herein that can efficiently and cost effectively receive several different combinations of signals, each having a frequency within one of a plurality of supported frequency ranges, such signals being aggregated together to form a carrier aggregated (CA) signal. The FECC uses a relatively small number of low noise amplifiers (LNAs). In one embodiment, wideband programmable band-switching LNAs are used to amplify signals within different supported frequency bands. The particular band to which the LNA is tuned depends upon the particular combination of supported frequency bands within the aggregated received signal. By providing at least one band-switching LNA, the number of LNAs can be reduced. In addition, an output switch matrix can be simplified or eliminated. In some embodiments, a switch at the output of at least one of the input filters allows the output of the filter to be selectively routed to one, two, or more amplifiers. Thus, it is not required that each filter have its own dedicated amplifier, making it possible to reduce the number of LNAs in the FECC.

In order to reduce the loading on the input of LNAs that service more than one filter, a shunt switch is provided at the output of each network of filters that can be selectively coupled to one LNA to remove that LNA from the circuit when it is not required. Alternatively, rather than adding an additional switch to the signal path to remove an inactive LNA, a shunt inductance is switched into the circuit to counteract the capacitive loading of the inactive LNA on the input of the active LNA to which the inactive LNA input is coupled.

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIG. 3 shows Table 1, in which the settings for each of the four switches of the FECC 200 are shown for each combination of supported frequency ranges that can be aggregated in a CA signal that can be fully received by the FECC.

Like reference numbers and designations in the various drawings indicate like elements.

DETAILED DESCRIPTION OF THE INVENTION

Figure 1A:
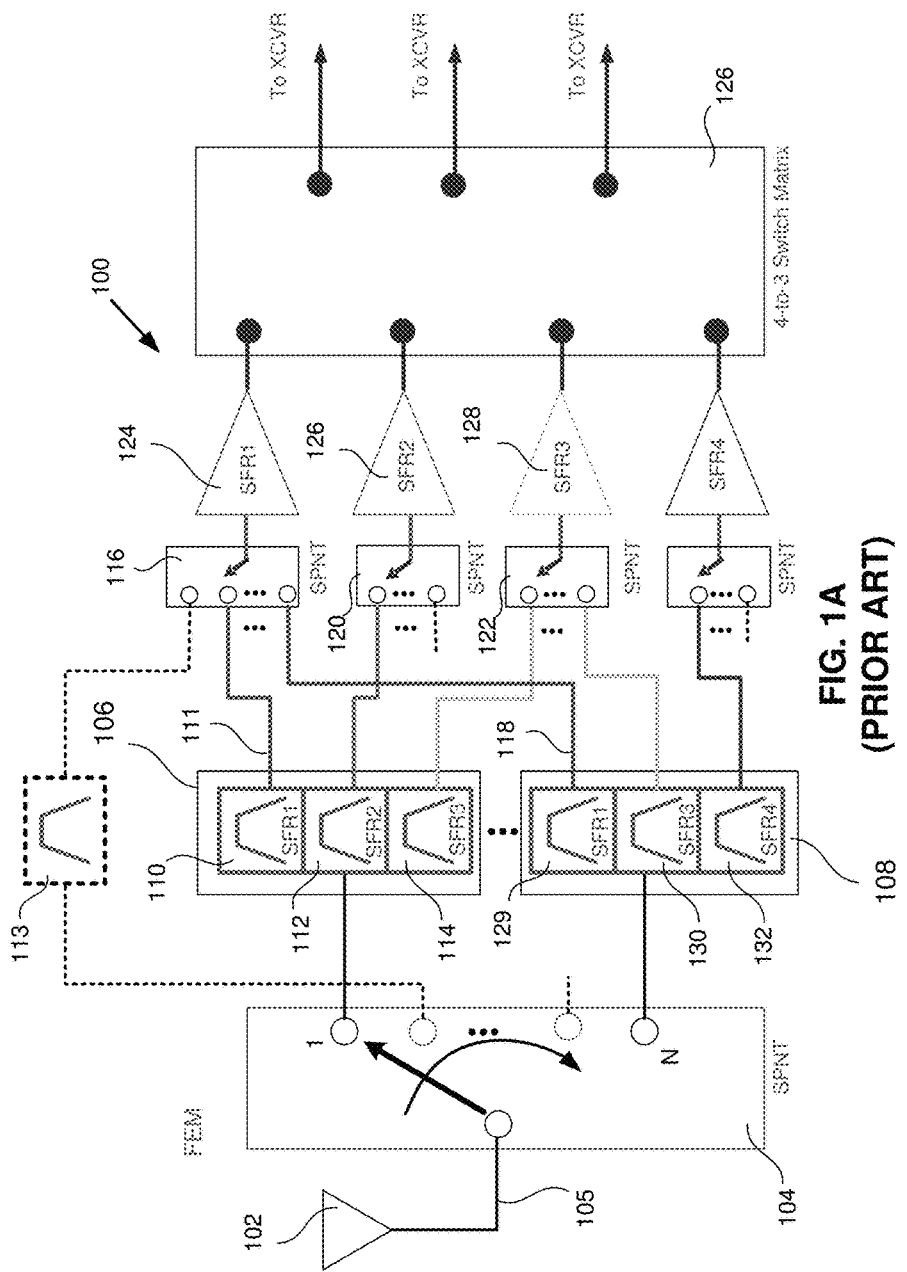
FIG. 1A is a simplified schematic of the front end circuit configuration (FECC) of a receiver designed to receive a CA signal.
Figure 1B:
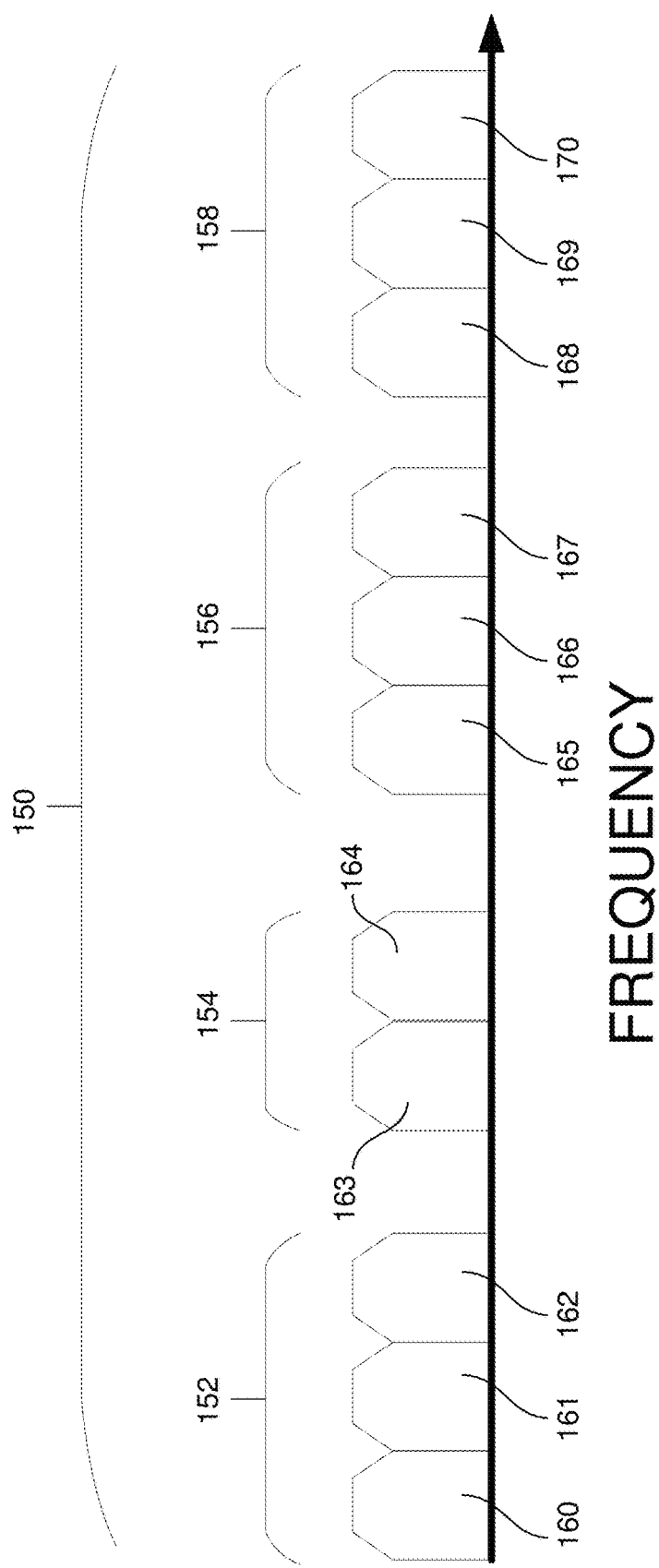
FIG. 1B is an illustration of a CA signal having eleven channels spread over four supported frequency ranges.
Figure 2A:
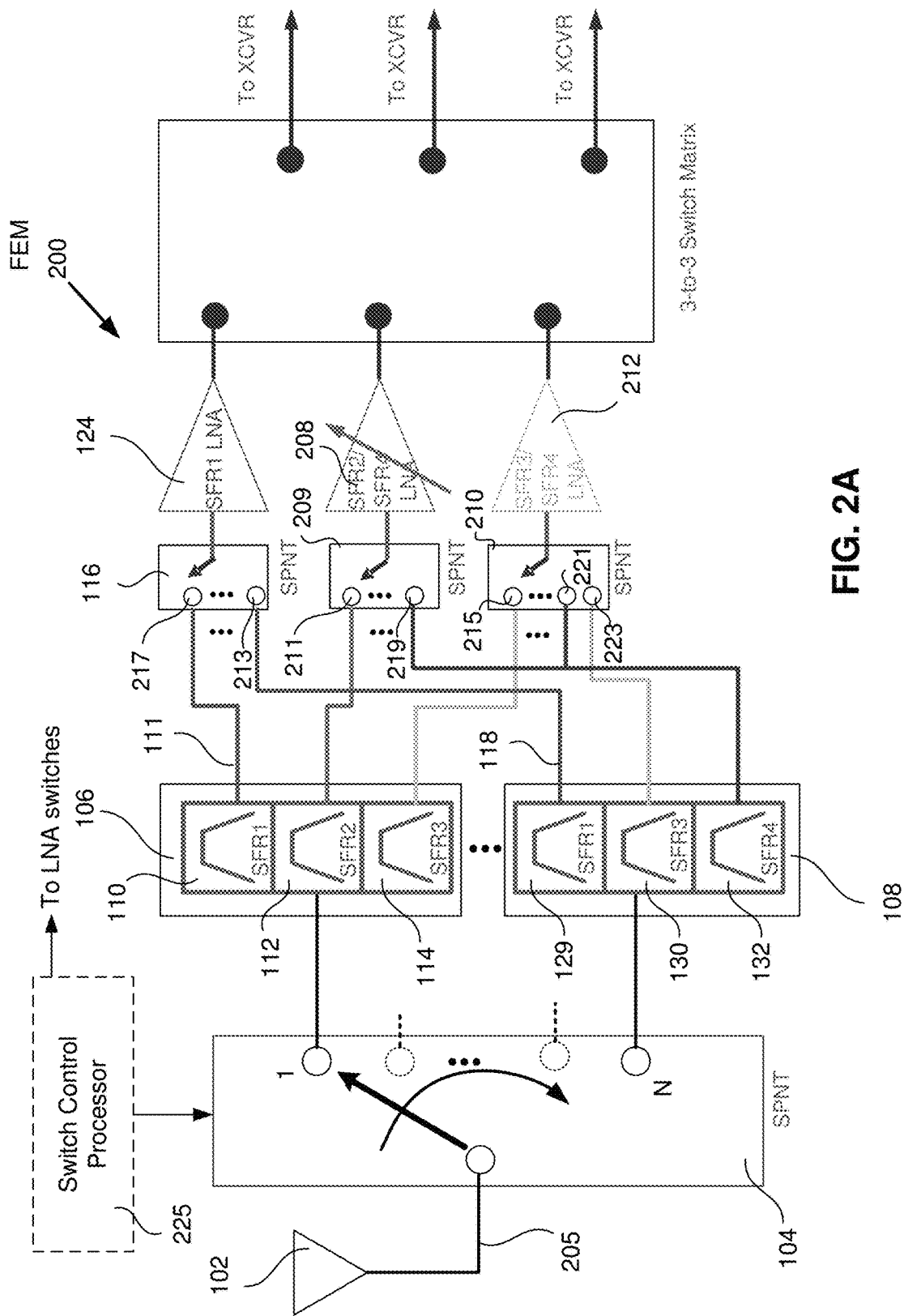
FIG. 2A is an illustration of a FECC of a communications receiver capable of handling several combinations of supported frequency ranges aggregated together in a carrier aggregation (CA) signal.

FIG. 2A is an illustration of a front end circuit configuration (FECC) 200 of a communications receiver capable of handling several combinations of signals having frequencies within supported frequency ranges, the signals aggregated together in a carrier aggregation (CA) signal. In general, the FECC of the disclosed method and apparatus is capable of receiving several desired combinations of aggregated supported frequency ranges, wherein the maximum number of supported frequency ranges within any particular CA signal is N. The number of low noise amplifiers is also equal to N. In addition, the number of switches in each signal path is equal to N. In particular, the FECC 200 shown in FIG. 2A can receive CA signals that have a maximum of three supported frequency ranges. The FECC 200 uses three low noise amplifiers (LNAs) 124, 208, 212 for amplifying CA signals. Some of the LNAs may be band-switching LNAs, as will become clear from the following description of FECC 200. In some embodiments, the FECC 200 also includes at least two banks of filters 106, 108. In other embodiments, the filter banks 106, 108 are external to the FECC 200. In the embodiment shown in FIG. 2A, each filter bank 106, 108 has three filters, each associated with one of the supported frequency ranges, similar to the filters shown in FIG. 1A.

Additional filter banks (not shown) having different combinations of filters may be present in other embodiments of the FECC 200. It should be noted that, while not shown, at least one filter bank may have only one filter. In some embodiments, three LNA input switches 116, 209, 210 are provided. Each input of each of the LNA input switches is configured to receive a portion of a received CA signal from the output of one or more of the filters 110, 112, 114, 129, 130, 132. In some embodiments, the switches 116, 209, 210 can reside outside the FECC 200. Each switch 116, 209, 210 is associated with a corresponding one of the three LNAs 124, 208, 212, the output of each switch 116, 209, 210 coupled to a corresponding input of one of the plurality of LNAs 124, 208, 212 such that there is a one to one relationship between the LNAs and LNA switches. Additional switch inputs to each switch 116, 209, 210 may also be present. Such additions are indicated by the ellipsis shown between the filter banks 106, 108 and between the switch inputs of the SFR1 switch 116, SFR2/SFR4 switch 209 and SFR3 switch 210. By providing a band-switching SFR2/SFR4 LNA 208 that has an operating frequency range that allows the LNA 208 to switch between signals in the SFR2 and SFR4 band, and by providing an SFR3/SFR4 LNA 212 that has an operating frequency range that allows the LNA 212 to amplify signals in both SFR3 and SFR4 frequencies, either by having a relatively flat frequency response over a wide operating frequency range or by switching to optimize operation over portions of a relatively wide operating frequency range, the FECC 200 can use just three LNAs to amplify all of the CA signals: (1) a CA signal 205 having an aggregation of SFR1, SFR2 and SFR3 signals; and (2) a CA signal 205 having an aggregation of SFR1, SFR3 and SFR4 signals. When the CA signal 205 being received includes an SFR1, SFR2 and SFR3 signal, the SFR2/SFR4 LNA operates in SFR2 mode to amplify the SFR2 signal. The SFR2/SFR4 LNA 208 is a band-switching LNA capable of switching between two modes of operation; SFR2 mode and SFR4 mode. In SFR2 mode, the SFR2/SFR4 LNA 208 is tuned for optimal operation in the SFR2 frequency range. The SFR3/SFR4 LNA 212 is then used to amplify the SFR3 signal. When the CA signal 205 being received includes an SFR1, SFR3 and SFR4 signal, the SFR2/SFR4 LNA 208 operates in SFR4 mode to amplify the SFR4 signal and the SFR3/SFR4 LNA 212 amplifies the SFR3 signal.

In other embodiments of the disclosed method and apparatus, the filter banks within the FECC may have different combinations of filters than those shown in FIG. 2A. Furthermore, alternative embodiments of the FECC may have filter banks with either more or less than three filters each. Such embodiments use one or more band-switching LNAs and/or one or more relatively broadband LNAs. A "relatively broadband" LNA is defined as an LNA that can effectively amplify two or more frequency ranges that may be either contiguous or are separated in frequency. Using a plurality of LNAs that include such broadband LNAs to amplify CA signals, allows the number of LNAs used for amplifying CA signals to be equal to the maximum number of supported frequency ranges that can be included in any one CA signal. Each LNA has an operating range that includes at least one from among the set of the supported frequency ranges (i.e., the set of all frequency ranges that can be included in any CA signal that the FECC is capable of receiving).

For example, the embodiment shown in FIG. 2A can receive at least two different CA signals. The first of these CA signals can include an aggregation of signals in three supported frequency ranges: SFR1, SFR2 and SFR3. The second of these CA signals can also include an aggregation of signals in three supported frequency ranges: SFR1, SFR3 and SFR4. Therefore, the set of supported frequency ranges includes SFR1, SFR2, SFR3 and SFR4. However, the maximum number of supported frequency ranges that are included in any one CA signal is three. By using the three LNAs 124, 208, 212, to amplify the received CA signals, the FECC 200 can support reception of both CA signals (although not at the same time) using only three LNAs. Each of the three LNAs has an operating frequency range that includes at least one supported frequency range from among the set of supported frequency ranges.

Alternative configurations of the FECC 200 are too numerous to depict in independent figures, but are within the scope of the disclosed method and apparatus and are fully contemplated by this disclosure. Such alternative configurations are included embodiments in which more than three filters are present in one or more of the filter banks, in which filters have different frequencies and in which each filter corresponds to one or more of the LNAs, some of which may be band-switching LNAs, as will become clear from the following description of FECC 200.

In the embodiment shown in FIG. 2A, the first bank of filters 106 includes three filters 110, 112, 114. Each of the filters is tuned to pass a particular frequency range. Each frequency range includes those frequencies associated with a channel or group of contiguous channels that can be grouped together in a CA signal being received by the communications receiver in which the FECC is to be used. For example, in some embodiments an FECC 200 can receive a CA signal 205 that includes up to three signals aggregated from the group including: (1) SFR1 signals; (2) SFR2 signals; (3) SFR3 signals; and (4) SFR4 signals. In some embodiments of the FECC 200, the SFR3 signals have a frequency in the range of 2.62 GHz-2.69 GHz. In some such embodiments, the SFR4 signals are in the range of 2.3-2.4 GHz. The SFR3 and SFR4 frequency ranges are provided merely as an example of one embodiment of the FECC 200. Accordingly, while the SFR3 signals and the SFR4 signals are in the same band (i.e., 2300-2700 MHz band) in some embodiments, they are not contiguous. In some embodiments, for example, SFR3 is in the range of 2300-2400 MHz and SFR 4 is in the range of 2620-2690 MHz.

In some embodiments, the first bank of filters 106 includes an SFR1 filter 110 tuned to receive SFR1 signals, an SFR2 filter 112 tuned to receive SFR2 signals and an SFR3 filter 114 tuned to receive SFR3 signals. A second bank of filters 108 has an SFR1 filter 129 tuned to receive SFR1 signals, an SFR3 filter 130 tuned to receive SFR3 signals and an SFR4 filter 132 tuned to receive SFR4 signals.

An input switch 104 selects between filter banks (i.e., the first filter bank 106, the second filter bank 108 or another filter bank (not shown)). Selection of the filter bank by the input switch 104 depends upon the particular combination of signals present in the CA signal 205 received through the antenna 102. That is, in order to keep the number of switches in each signal path to a minimum, each filter bank 106, 108 has a complete set of filters needed to pass all of the signals that might be aggregated together in a CA signal 205 to be received. The LNA input switches 116, 209, 210 determine which signals (i.e., which filter outputs) are to be routed to each LNA 124, 208, 212. The disclosed method and apparatus reduces to three the total number of LNAs required for the FECC 200 to receive a desired CA signal 205. In the case of the FECC 200, the desired CA signals 205 include any CA signal 205 having one SFR1 signal, one SFR2 signal and one SFR3 signal or any combination of these three signals. In addition, the desired CA signals 205 include any CA signal 205 having one SFR1 signal, one SFR3 signal and one SFR4 signal or any combination of these three signals. The number of LNAs is reduced to three by using at least one band-switching LNA, such as the SFR2/SFR4 LNA 208 of FECC 200 and at least one relatively broadband LNA, such as the SFR3/SFR4 LNA 212 of FECC 200, as will be described in more detail below.

FIG. 3 shows Table 1, in which the settings for each of the four switches 104, 116, 209, 210 of the FECC 200 are shown for each combination of signals that can be aggregated in a CA signal 205 that can be fully received by the FECC 200. An "x" in the column 301 headed "SFR1 signals" indicates that an SFR1 signal is present in the CA signal 205 being received. Likewise, an "x" in the other columns 302, 303, 305 indicates that the signal noted in the column header is present in the CA signal 205 being received. A column 307, 309, 311, 313 is associated with each of the switches 104, 116, 209, 210 to indicate which input is selected for the particular combination of aggregated supported frequency ranges shown in the same line of Table 1. For example, in line 1, the CA signal 205 being received includes an SFR1 signal within a first supported frequency range, an SFR2 signal within a second supported frequency range and an SFR3 signal within a third supported frequency range. No SFR4 signal is present in the CA signal 205 being received of line 1. With the combination of supported frequency ranges shown in line 1, the input switch 104 selects the output coupled to the first filter bank 106, as indicated in the column 307; the SFR1 switch 116 selects the SFR1 filter 110 of the first filter bank 106, as indicated in the column 309 (i.e., input 217); the SFR2/SFR4 switch 209 selects the SFR2 filter 112, as indicated in the column 311 (i.e., input 211); and the SFR3/SFR4 switch 210 selects the filter 114 of the first filter bank 106, as indicated in the column 313 (i.e., input 215).

It is possible for the FECC 200 to receive a CA signal 205 in which any one of 11 combinations of supported frequency ranges are present (i.e., aggregations of supported frequency ranges shown in lines 1-11 of Table 1). The particular combinations of supported frequency ranges with the CA signal 205 being received is limited by which filters are present in each of the two filter banks 106, 108 that are shown in FIG. 2A. Other embodiments that have filter banks with different filters would alter the combinations of supported frequency ranges that can be present in a CA signal 205 being received. Other embodiments do not have filter banks as shown in FIG. 2A, but instead have individual filters which may be combined by the input switch 104 using a "direct mapping" scheme. For the embodiment shown in FIG. 2A, the input switch 104 routes the CA signal 205 being received to either the first filter bank 106 or to the second filter bank 108 depending upon whether the CA signal 205 being received includes an SFR2 signal or an SFR4 signal.

It should be noted that in alternative embodiments, an Auxiliary (AUX) input (see FIG. 4) may be provided in the FECC. One or more such AUX inputs are directly coupled to one or more of the LNA switches 116, 209, 210 without being filtered. That is, supported frequency ranges applied to the AUX input can be directly coupled to an input of one or more of the LNA input switches 116, 209, 210. Typically, such signals are filtered prior to being coupled to the AUX input. For example, an AUX input could be provided that is coupled to an input of the SFR2/SFR4 switch 209. An SFR2 signal could then be applied to the AUX input. By the SFR2/SFR4 switch 209 selecting the input to which the AUX input is coupled, the SFR2 signal can be applied to the input of the SFR2/SFR4 LNA 208. The SFR2/SFR4 LNA 208 would then operate in SFR2 mode to amplify the SFR2 signal. Similarly, the AUX input could be coupled to an input to either the SFR3/SFR4 switch 210 or the SFR1 switch 116. Depending upon the supported frequency range applied to the AUX input, in either the SFR1 switch 116 or the SFR3/SFR4 switch 210 could select the AUX input. Accordingly, the supported frequency range applied to the AUX input would be amplified by the selected LNA 124, 208, 212.

SFR2 Signal Present

Looking again at the embodiment of the FECC 200 shown in FIG. 2A, when the CA signal 205 being received includes an SFR2 signal, as is shown in lines 1, 2, and 4 of Table 1, or is a non-CA SFR2 signal 205, as is shown in line 5, the input switch 104 must couple the antenna 102 to a filter bank having an SFR2 filter 112 (or to a path that is unfiltered (not shown in FIG. 2A)). It should be noted that a "non-CA signal" is a signal in which the frequency is contiguous over the full spectrum of the signal of interest, such as a signal in the SFR2 frequency range. In the embodiment shown in FIG. 2A, first filter bank 106 has an SFR2 filter 112. The second filter bank 108 does not.

Accordingly, it can be seen from Table 1 that in each line 1, 2, 4 and 5 in which the CA signal 205 being received includes an SFR2 signal, or as in line 5 the received signal is a non-CA SFR2 signal 205, the first filter bank 106 is selected by the input switch 104. It should be noted that the filter bank 106 does not include an SFR4 filter. It should also be noted that the second filter bank 108 does include an SFR4 filter 132, but does not include an SFR2 filter 112. Furthermore, the CA signal 205 being received can only be routed to one of the filter banks 106, 108 at a time. Therefore, the FECC 200 cannot receive a CA signal 205 in which an SFR2 signal is aggregated with an SFR4 signal. However, if such a scenario were required it could be supported with a different filter configuration than that shown in FIG. 2A.

The input of the first filter bank 106 is coupled to the input to each of the filters 110, 112, 114. The SFR2 filter 112 outputs the filtered SFR2 signal. The output of the SFR2 filter 112 is coupled to an input 211 of the SFR2/SFR4 switch 209. A second input 219 to the SFR2/SFR4 switch 209 is coupled to the output SFR4 filter 132 of the second filter bank 108. In some embodiments, a third input is coupled to a termination. It should be noted that for the sake of simplicity, terminations are not shown coupled to the input of any of the LNA switches 116, 209, 210 in FIG. 2A. The SFR2/SFR4 switch 209 can select one of the inputs to be coupled to the switch output, which is coupled to the input of the SFR2/SFR4 LNA 208. It can be seen from Table 1 that whenever the CA signal 205 being received includes an SFR2 signal, as in lines 1, 2 and 4, or if a non-CA SFR2 signal is received, as shown in line 5, the SFR2/SFR4 switch 209 selects the input that is coupled to the SFR2 filter 112, as indicated in column 311 of lines 1, 2, 4 and 5 in Table 1.

When the CA signal 205 being received includes an SFR2 signal, as in lines 1, 2 and 4 of Table 1, or is a non-CA signal 205 at SFR2 frequency, as in line 5, the SFR2/SFR4 LNA 208 is set to SFR2 mode. If the CA signal 205 being received also includes an SFR3 signal aggregated with the SFR2 signal, then the SFR3/SFR4 switch 210 selects input 215 that is coupled to the output of the SFR3 filter 114 of the first filter bank 106, as shown in column 313 of lines 1 and 4 in Table 1. The output of the SFR3/SFR4 switch 210 is coupled to an SFR3/SFR4 LNA 212. In some embodiments, the SFR3/SFR4 LNA 212 is a relatively broadband amplifier that is tuned to amplify signals over a frequency range that includes both the frequencies of the SFR3 signal and the frequencies of the SFR4 signal. Accordingly, the SFR3/SFR4 LNA 212 need not switch modes, in contrast with the operation of the SFR2/SFR4 LNA 208. In another embodiment, the SFR3/SFR4 LNA 212 is a band switching LNA, the tuning mode of which is selected depending on whether the intended input signal is in the SFR3 or SFR4 frequency range.

SFR4 Signal Present

When the CA signal 205 being received from the antenna 102 is an aggregate including at least an SFR4 signal, as shown in lines 8-11 of Table 1, including the case of a non-CA signal 205 being received at SFR4 frequency, the input switch 104 selects a filter bank having an SFR4 filter 132. In the case shown in FIG. 2A, the input switch 104 selects the second filter bank 108. That includes the case in which the CA signal 205 being received has only an SFR4 signal. When the input switch 104 selects the second filter bank 108, the CA signal 205 being received is coupled to the input of each of the filters 129, 130, 132 of the second filter bank 108. The output of the SFR4 filter 132 is coupled to an input 219 of the SFR2/SFR4 switch 209 and to an input 221 of the SFR3/SFR4 switch 210. Accordingly, the inputs of at least two different LNA switches 209, 210 receive the same portion of the received input signal. Therefore, the SFR4 signal output from the SFR4 filter 132 can be amplified by either the SFR2/SFR4 LNA 208 or the SFR3/SFR4 LNA 212, depending upon the selection made by each of the LNA switches 209, 210, which in turn depends upon the other supported frequency ranges aggregated with the SFR4 signal, as shown in lines 8-11 of Table 1. That is, when the SFR4 signal is aggregated with an SFR3 signal in the CA signal 205 being received, the SFR2/SFR4 switch 209 selects the input 219 that is coupled to the SFR4 filter 132, as indicated in lines 9 and 10 of Table 1. The SFR3/SFR4 switch 210 selects the input 223 that is coupled to the SFR3 filter 130 of the second filter bank 108, as shown in column 313 on lines 9 and 10 of Table 1.

If instead, the CA signal 205 being received includes an SFR4, but does not include an SFR3 signal, as shown in lines 8 of Table 1, or is a non CA signal 205 at SFR4 frequency, then the SFR3/SFR4 switch 210 selects the input that is coupled to the SFR4 filter 132. The output of the SFR3/SFR4 switch 210 is coupled to the SFR3/SFR4 LNA 212. It can be seen that when there is an SFR4 signal and no SFR3 signal present in the CA signal 205 being received, the SFR4 signal can either be routed through the SFR3/SFR4 switch 210 to the SFR3/SFR4 LNA 212, or alternatively, routed by the SFR2/SFR4 switch 209 to the SFR3/SFR4 LNA 208 as long as SFR4 is not aggregated with SFR2. In the embodiments shown in Table 1 of FIG. 3, an SFR4 signal is routed to the SFR3/SFR4 LNA 212 whenever there is no SFR3 signal in the signal 205 being received (lines 8 and 11 of Table 1). That assumes that the SFR3/SFR4 LNA 212 provides better performance at SFR4 frequencies then the SFR2/SFR4 LNA 208. Accordingly, the SFR2/SFR4 switch 209 may select an input that is coupled to a termination and/or the SFR2/SFR4 LNA 208 can be turned off (as noted in columns 311, 313, 317, 319 of lines 8 and 11 in Table 1).

However, in other embodiments, the SFR2/SFR4 LNA 208 operating in SFR4 mode provides better performance than the SFR3/SFR4 LNA 212 at the SFR4 frequencies. In such cases, when the CA signal 205 being received includes an SFR4 signal, but does not include an SFR3 signal or an SFR2 signal, the SFR2/SFR4 switch 209 will select the input that is coupled to the SFR4 filter 132. In that case, the SFR3/SFR4 LNA 212 will not be needed. Accordingly, the SFR3/SFR4 switch 210 may select an input that is coupled to a termination and/or the SFR3/SFR4 LNA 212 can be turned off (not shown in Table 1).

When the signal 205 being received includes an SFR1 signal and an SFR4 signal and no SFR3 or SFR2 signal, as shown in line 8 of Table 1, the SFR1 switch 116 selects the input 213 coupled to the SFR1 filter 129 of the second filter bank 108. In some embodiments, the SFR2/SFR4 switch 209 selects an input that is coupled to a termination and/or the SFR2/SFR4 LNA 208 can be turned off (as noted in columns 311, 317 of line 8 in Table 1). If there is no SFR1 signal aggregated in the CA signal 205 being received (i.e., a non-CA signal 205 being received at SFR4 frequency, as shown in line 11 of Table 1), then in some embodiments, both the SFR1 switch 116 and the SFR2/SFR4 switch 209 select inputs that are coupled to terminations and/or one or both of the SFR2/SFR4 LNA 208 and the SFR1 LNA 124 can be turned off, as indicated in columns, 309, 311, 315, 317 of line 11 in Table 1.

In the case shown in line 9 of Table 1 in which the CA signal 205 being received includes an SFR1 signal, the SFR1 switch 116 selects the input 213 coupled to the SFR1 filter 129 of the second filter bank 108. If there is no SFR1 signal or SFR2 signal aggregated in the CA signal 205 being received, then in some embodiments, the SFR1 switch 116 selects an input that is coupled to a termination and/or the SFR1 LNA can be turned off, as indicated in column 309, 315 of line 10 in Table 1.

II. No SFR2 Signal or SFR4 Signal being Received

When the signal 205 being received includes neither an SFR2 signal nor an SFR4 signal (i.e., a non-CA SFR1 signal, a non-CA SFR3 signal SFR3 and/or a CA signal 205 aggregating an SFR1 and SFR3 signal) either filter bank 106, 108 can be selected by the input switch 104. In some embodiments, the SFR2/SFR4 switch 209 selects an input that is coupled to a termination and/or the SFR2/SFR4 LNA 208 is turned off, as indicated in columns 311, 317 of lines 3, 6 and 7 in Table 1. If the first filter bank 106 is selected and an SFR1 signal is present in the CA signal 205 being received, as shown in lines 3 or a non-CA SFR1 signal 205 is being received as in line 7, then the SFR1 switch 116 selects the input 217 coupled to the SFR1 filter 110 of the first filter bank 106. In some embodiments, if a non-CA SFR1 signal 205 is being received (line 7), the SFR3/SFR4 switch 210 selects an input coupled to a termination and/or the SFR3/SFR4 LNA 212 can be turned off, as indicated in columns 313, 319 of line 7 of Table 1. If there is an SFR3 signal present in the CA signal 205 being received, as shown in lines 3, or the received signal 205 is a non-CA signal 205 as in line 6, then the SFR3/SFR4 switch 210 selects the input 215 coupled to the SFR3 filter 114 of the first filter bank 106, as shown in column 313 of lines 3 and 6. In some embodiments, if there is no SFR1 signal, then the SFR1 switch 116 selects an input coupled to a termination and/or the SFR1 LNA 124 can be turned off, as indicated in column 309, 315 of line 6 in Table 1. In embodiments in which the second filter bank 108 is selected by the input switch 104, the SFR1 switch 116 and the SFR3/SFR4 switch 210 each select the corresponding input coupled to the SFR1 and SFR3 filters 129, 130 of the second filter bank 108 (not shown in Table 1).

In some embodiments, such as the embodiment shown in Table 1, it may be more efficient for the FECC to route the CA signal 205 being received to the first filter bank 106, unless an SFR4 signal is present in the CA signal 205 being received. Nonetheless, in other embodiments in which the CA signal 205 being received may be continuously changing, it may be more efficient to determine the previous position of the input switch 104 before selecting which filter bank is to be used when no SFR4 signal is present.

Figure 2B:
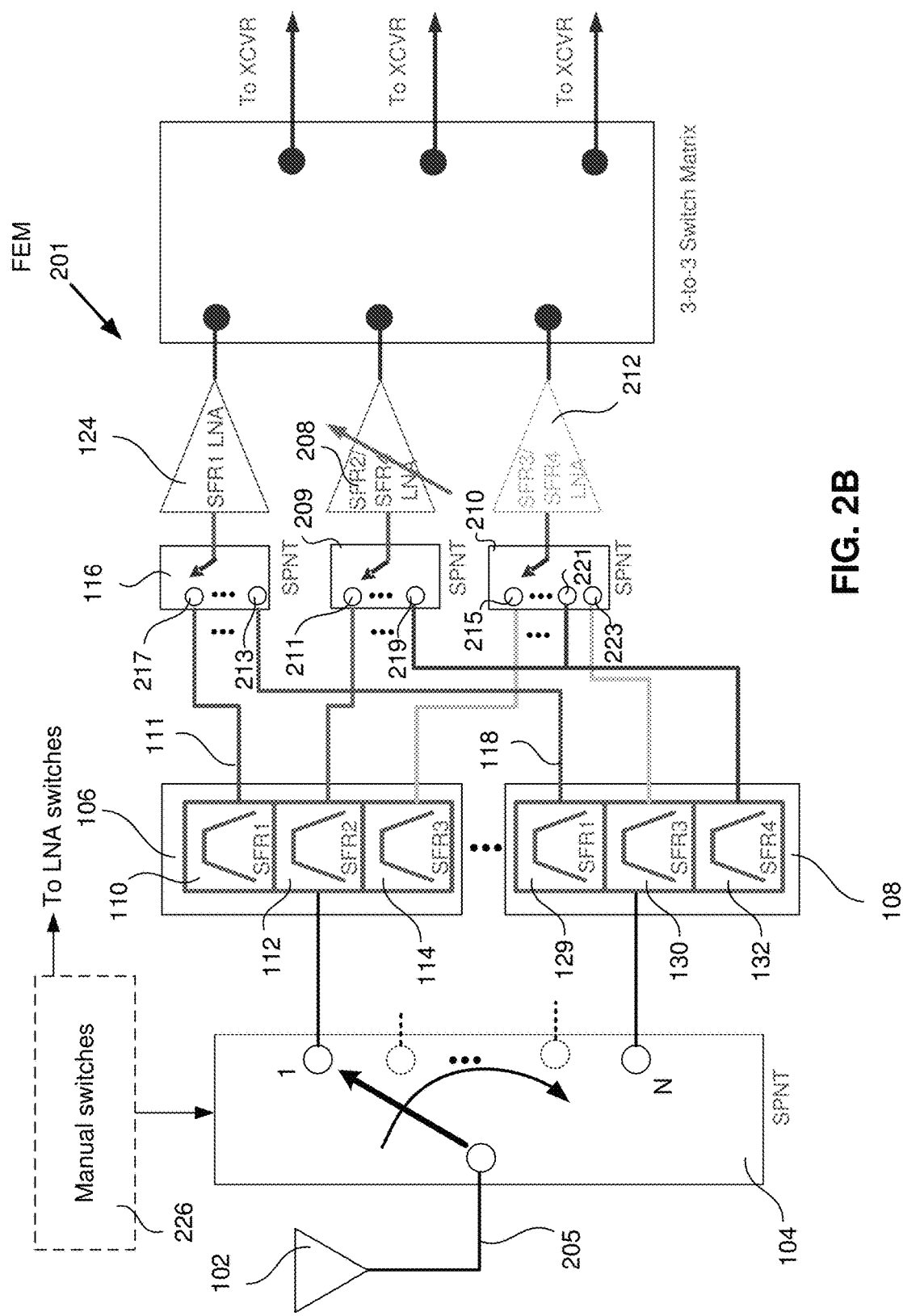
FIG. 2B is an illustration of an embodiment of an FECC in which manual switches are provided to set the particular switch configuration based on the user's knowledge of the supported frequency ranges that will be expected to be present in the CA signal being received.

In some embodiments, each of the switches 104, 116, 209, 210 are controlled by a switch control processor 225, state machine or other control system to coordinate the operation of the input switch 104 with the operation of each of the LNA switches 116, 209, 210. The operation is performed according to the decisions noted in Table 1 or as noted above for alternative embodiments. The switch control processor 225 is shown in dashed line to indicate that it is optional. FIG. 2B is an illustration of an embodiment of an FECC 201 in which manual switches 226 are provided to set the particular switch configuration based on the user's knowledge of the supported frequency ranges that will be expected to be present in the CA signal 205 being received. In one embodiment, the manual switches 226 can be actuated by the user. Such manual switches 226 would typically provide a control signal to the input switch 104 and to the LNA switches 116, 209, 210.

It should be understood that the particular combinations of filters shown in the example FECC 200 are merely provided to make the concepts clear. Accordingly, filter banks with additional combinations of filters may be present in the FECC 200, as indicated by the ellipsis shown between the filter banks 106, 108 and between the switch inputs of the SFR1 switch 116, SFR2/SFR4 switch 209 and SFR3 switch 210. Still further, the filter banks of other FECs not shown for the sake of simplicity may not have the particular combination of filters provided in the FECC 200 shown in FIG. 2A. In such cases, the band-switching LNA may switch between different bands. For example, in some embodiments, the band-switching amplifier may switch between an SFR1 mode and an SFR2 mode, rather than between an SFR2 mode and an SFR4 mode. In other embodiments, it may be possible for the band-switching amplifier to switch between an SFR1 mode and an SFR4 mode. However, it will be understood that the greater the difference between the frequency of the two bands at which the band-switching LNA has to operate, the more likely it is that the performance of the LNA will be compromised in at least one of the bands. It should also be noted that while the SFR2/SFR4 LNA 208 is switchable between two modes, each of which places the LNA in a configuration that optimizes the performance of the LNA to one of two different bands, the SFR3/SFR4 LNA 212 is not a band switching LNA. Rather the SFR3/SFR4 LNA 212 is a relatively broadband LNA that can operated over the entire SFR3+SFR4 frequency range (or at least that part of a greater frequency range that includes both the SFR3 and SFR4 channels).

Selected Implementations

Figure 4:
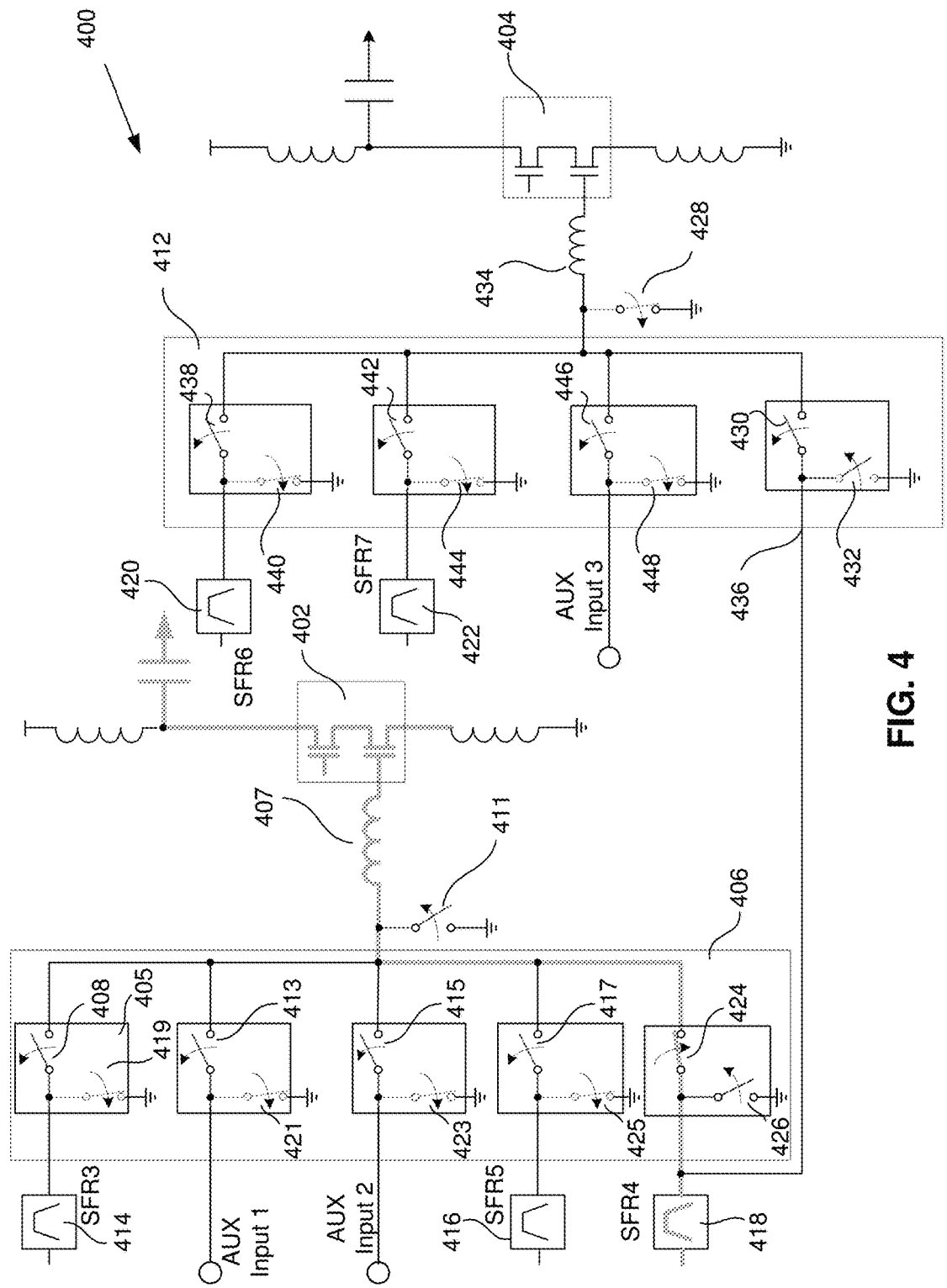
FIG. 4 is a simplified schematic of portions of an FECC with the switches set for reception of a non-CA signal being received at the SFR4 frequency.

FIG. 4 is a simplified schematic of portions of an FECC 400 capable of receiving signals in any one or more of the following supported frequency ranges: SFR3, SFR4, SFR5, SFR6 and SFR7. In the example shown in FIG. 4, the frequencies of SFR 3 and SFR 4 are the same as noted above. The frequency range of SFR5 is 2496-2690 MHz, the frequency range of SFR6 is 1930-1990 and the frequency range of SFR7 is 1805-1880 GHz. The FECC 400 is shown with the switches set for reception of a non-CA signal being received at the SFR4 frequency. The FECC 400 is shown to have an SFR3/SFR4/SFR5 LNA 402 and an SFR6/SFR7/SFR4 LNA 404. In some embodiments, the two filters SFR3 414 and SFR4 418 may be grouped together in a first filter bank (similar to that of filter bank 106 of FIG. 2) and SFR5 416 and SFR6 420 and/or SFR7 422 may be grouped together in a second filter bank (similar to that of filter bank 108 in FIG. 2).

The SFR3/SFR4/SFR5 LNA 402 is tuned to operate in the SFR3 frequency range and in the SFR4 frequency range. The SFR6/SFR7/SFR4 LNA 404 is tuned for optimal operation in the frequency range of SFR6 and SFR7, but can also be switched to operate in the SFR4 frequency range. Note that the SFR6/SFR7/SFR4 LNA is a band switching LNA that can operate in two different frequency ranges (i.e., both the SFR4 frequency range and the SFR6/SFR7 frequency range). That is, the SFR6/SFR7/SFR4 LNA 404 has two modes, as was discussed above with regard to the SFR2/SFR4 LNA 208 of FECC 200. In contrast, SFR3/SFR4/SFR5 LNA 402 is tuned to operate over a range of frequencies that includes frequencies of the SFR3, SFR4 and SFR 5 signals without the need for switching of any LNA components, similar to the SFR3/SFR4 LNA 212 of FECC 200. For the sake of simplicity, the switches and components necessary for the SFR6/SFR7/SFR4 LNA 208 to switch modes are not shown. However, such mode-switching circuitry will be known to those skilled in the art. Nonetheless, a wideband LNA could be used rather than the band switching LNA shown.

An SFR3/SFR4/SFR5 switch 406 has an output coupled to an inductor 407. The inductor 407 couples the SFR3/SFR4/SFR5 switch 406 to the input of the SFR3/SFR4/SFR5 LNA 402. The SFR3/SFR4/SFR5 switch 406 can be implemented as a SP5T (single pole/5 throw) switch. In the embodiment shown in FIG. 4, the five throws of the SFR3/SFR4/SFR5 switch 406 are illustrated by five pairs of SPST (single pole/single throw) switches. For example, the first throw is illustrated by switches 408, 419. In addition, a SPST switch 411 is provided that can shunt the output of the switch 406 to ground. Accordingly, one of five different inputs of the SFR3/SFR4/SFR5 switch 406 can be selected by the SFR3/SFR4/SFR5 switch 406. In addition, the output of the switch can be shunted to ground. The first input to the SFR3/SFR4/SFR5 switch 406 is coupled to an SFR3 filter 414. The fifth input is coupled to an SFR4 filter 418. The fourth input is coupled to an SFR5 filter 416. The other two signal inputs to the SFR3/SFR4/SFR5 switch 406 are unfiltered in the FECC 400. In some such embodiments, these inputs may be used as AUX inputs that can support signals that are not limited to particular frequency ranges, as long as they are within the SFR3/SFR4/SFR5 frequency.

Similarly, an SFR6/SFR7/SFR4 switch 412 is shown as an SP4T (single pole, 4 throw) switch. The SFR6/SFR7/SFR4 switch 412 has four signal inputs. A first of the inputs is coupled to an SFR6 filter 420. A second of the inputs is coupled to an SFR7 filter 422. One of the other two signal inputs is an unfiltered AUX input 3. That is, as with the unfiltered AUX 1, AUX 2 inputs to the SFR3/SFR4/SFR5 switch 406, the unfiltered AUX 3 input can be used as AUX inputs to provide flexibility to a user for any SFR4, SFR6, or SFR7 frequency without limitations of a filter at the input. The fourth input to the SFR6/SFR7/SFR4 switch 412 is coupled to the SFR4 filter 418. Accordingly, as noted above with respect to FECC 200, the SFR6/SFR7/SFR4 switch 412 can be used to route an SFR4 input to the SFR6/SFR7/SFR4 LNA 404 when the SFR6/SFR7/SFR4 LNA 404 is in SFR4 mode. In addition, a shunt switch 428 provides a shunt path to ground for the output of the switch 412 when none of the inputs to the switch 412 are selected (i.e., when switches 430, 438, 442, 446 are open).

The switches 406, 412 are shown in FIG. 4 to be set for a non-CA signal to be received at the SFR4 frequency (i.e., the frequency to which the SFR4 filter 418 is tuned). Accordingly, the fifth throw of switch 406 is closed to select the input of the switch 406 that is coupled to the SFR4 filter 418. That is, the switch 424 is closed and the switch 426 to ground is open. Each of the other throws are open. The shunt switch 411 is also open to allow the SFR4 signal from the SFR4 filter 418 to be routed through the inductor 407 to the SFR3/SFR4/SFR5 LNA 402.

Since the received signal is a non-CA signal being received at the SFR4 frequency, the SFR6/SFR7/SFR4 LNA 404 is not operational. In order to isolate the SFR6/SFR7/SFR4 LNA 404 from the input of the SFR4 filter 418, the shunt switch 428 is closed, putting the input to the SFR6/SFR7/SFR4 LNA 404 at ground potential to prevent low impedance resonances from occurring within the SFR6/SFR7/SFR4 LNA 404.

Figure 5:
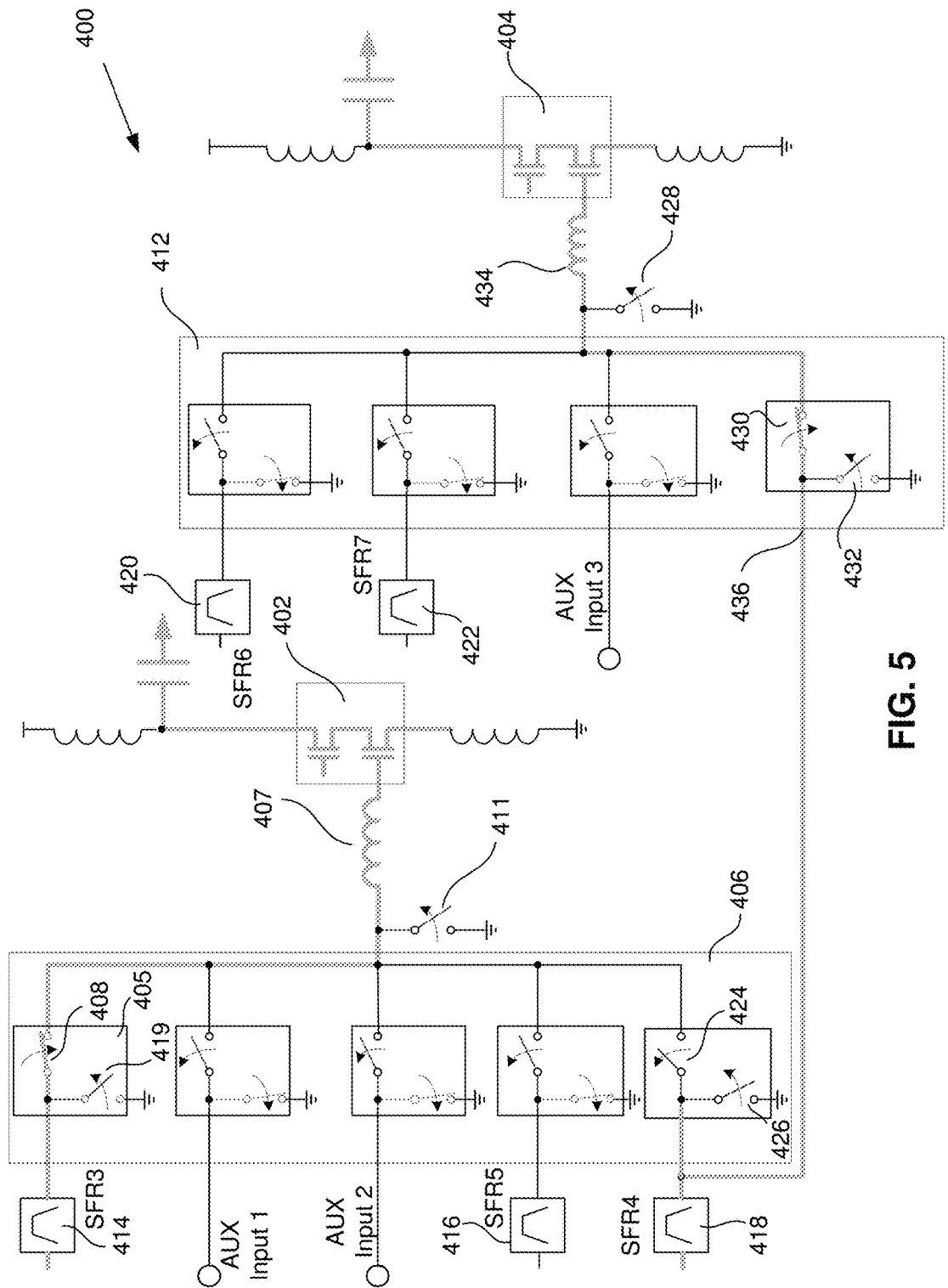
FIG. 5 is a simplified schematic of some portions of an FECC with the switches set to receive a CA signal having an SFR3 signal aggregated with an SFR4 signal.

FIG. 5 is a simplified schematic of some portions of an FECC 400 with the switches set to receive a CA signal having an SFR3 signal aggregated with an SFR4 signal. Accordingly, at least an SFR3 signal is present at the input of the SFR3 filter 414 and an SFR4 signal is present at the input of the SFR4 filter 418. The SFR3/SFR4/SFR5 switch 406 selects the SFR3 signal output from the SFR3 filter 414 to be coupled to the input of the SFR3/SFR4/SFR5 LNA 402 by closing the switch 408 and opening the switch 419. In addition, the switches 424, 426 associated with the SFR4 filter 418 are both opened to assist in routing the SFR4 signal output from the SFR4 filter to the SFR6/SFR7/SFR4 switch 412. That is, the switch 424 is opened to open the connection to the SFR3/SFR4/SFR5 LNA 402. In addition, opening the switch 426 ensures that the output of the SFR4 filter 418 is not shunted to ground.

A connection from the output of the SFR4 filter 418 to the fourth input 436 of the SFR6/SFR7/SFR4 switch 412 provides a signal path for the SFR4 signal to the SFR6/SFR7/SFR4 LNA 404 through the SFR6/SFR7/SFR4 switch 412. More particularly, a path is provided through the switch 430 within the SFR6/SFR7/SFR4 switch 412. In addition, the shunt switch 428 at the output of the SFR6/SFR7/SFR4 switch 412 is opened to remove the shunt to ground from input of the SFR6/SFR7/SFR4 LNA 404.

Figure 6:
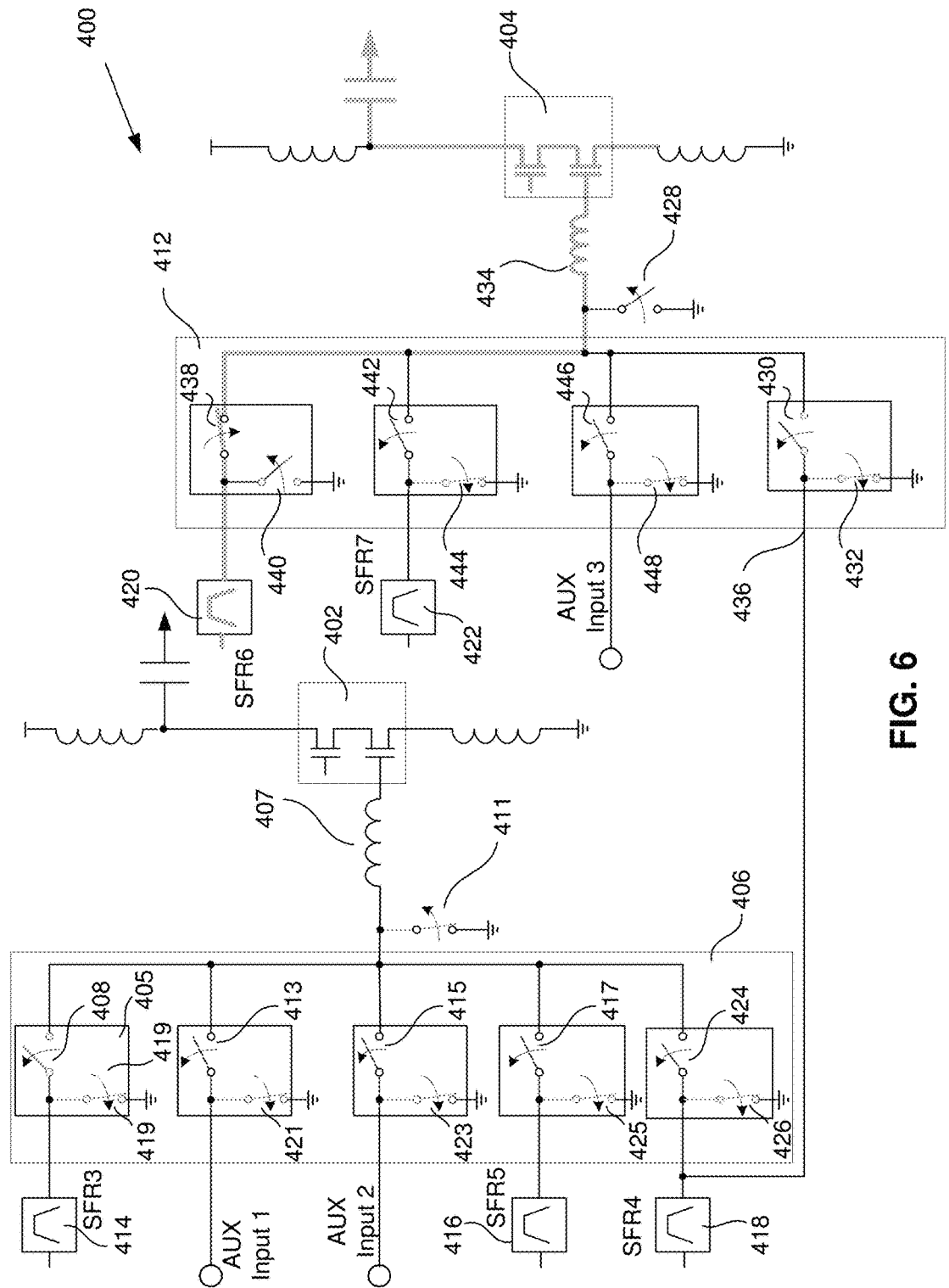
FIG. 6 is a simplified schematic of some portions of an FECC with the switches set to receive a non-CA signal at the SFR6 frequency.

FIG. 6 is a simplified schematic of some portions of an FECC 400 with the switches set to receive a non-CA signal at the SFR6 frequency. To receive a non-CA signal at the SFR6 frequency, the SFR3/SFR4/SFR5 switch 406 deselects all inputs. That is, each of the switches 408, 413, 415, 417, 424 within the SFR3/SFR4/SFR5 switch 406 are opened. In addition, each of the ground switches 419, 421, 423, 425, 426 within the SFR3/SFR4/SFR5 switch 406 are closed. Also, the shunt switch 411 at the output of the SFR3/SFR4/SFR5 switch 406 is closed to shunt the input of the unused SFR3/SFR4/SFR5 LNA 402 to ground. Shunting the SFR3/SFR4/SFR5 LNA 402 to ground when it is inactive (i.e., no input is provided) ensures that the SFR3/SFR4/SFR5 LNA 402 will not generate low impedance resonances. The first input to the SFR6/SFR7/SFR4 switch 412 is selected, thereby coupling the output of the SFR6 filter 420 to the input of the SFR6/SFR7/SFR4 LNA 404. The shunt switch 428 at the output of the SFR6/SFR7/SFR4 switch 412 is opened, removing the shunt to ground from the input of the SFR6/SFR7/SFR4 LNA 404.

Figure 7:
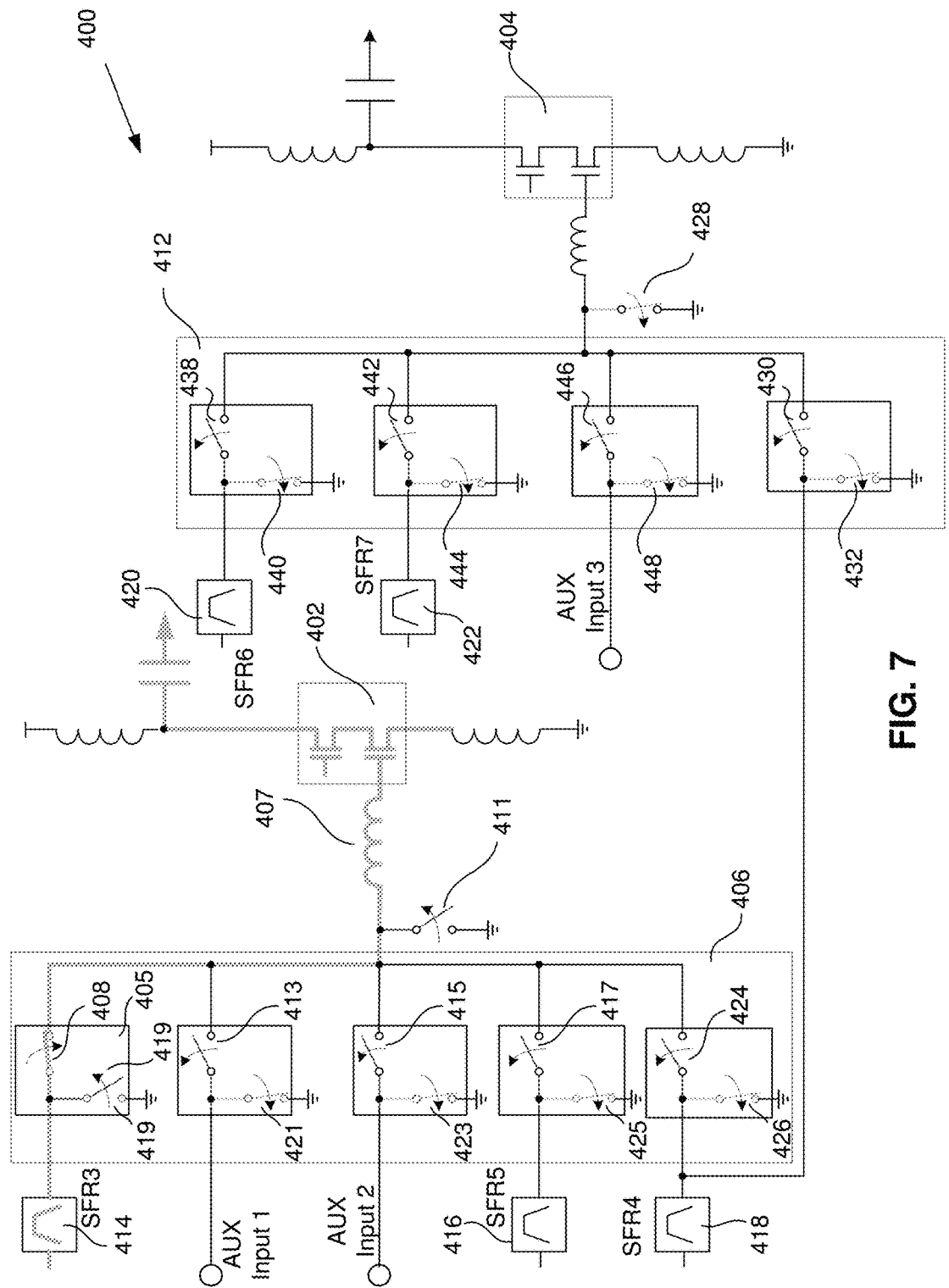
FIG. 7 is a simplified schematic of some portions of an FECC with the switches set to receive a non-CA signal at the SFR3 frequency.

FIG. 7 is a simplified schematic of some portions of an FECC 400 with the switches set to receive a non-CA signal at the SFR3 frequency. When receiving a non-CA signal at the SFR3 frequency, the switches of the SFR3/SFR4/SFR5 switch 406 is set to select the signal from the SFR3 filter 414. The switch 428 is closed to shunt the input of the SFR6/SFR7/SFR4 LNA to ground. With the first input to the SFR3/SFR4/SFR5 switch 406 is selected and all other inputs to the SFR3/SFR4/SFR5 switch 406 deselected, the switches 408, 421, 423, 425, 426 within the SFR3/SFR4/SFR5 switch 406 are closed. The switches 419, 413, 415, 417, 424 within the SFR3/SFR4/SFR5 switch 406 are opened. In addition, all of the inputs of the SFR6/SFR7/SFR4 switch 412 are deselected. That is, switches 438, 442, 446, 430 within the SFR6/SFR7/SFR4 switch 412 are opened and all of the switches 440, 444, 448, 432 within the SFR6/SFR7/SFR4 switch 412 are closed. In addition, the input to the inactive SFR6/SFR7/SFR4 LNA 404 is shunted to ground by closing the shunt switch 428.

Figure 8:
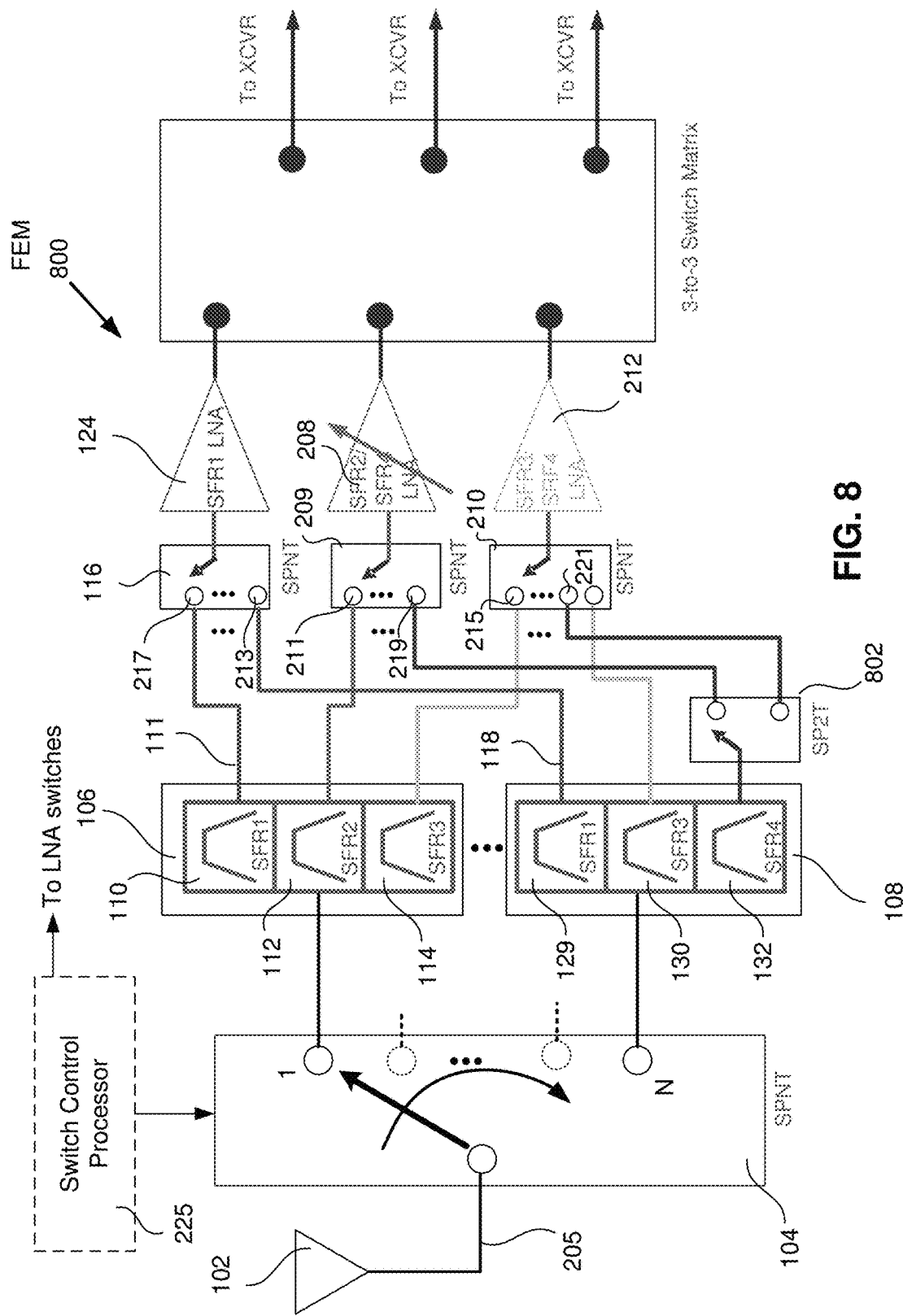
FIG. 8 is an illustration of an embodiment of an FECC in which an additional SP2T switch is provided to selectively couple the SFR4 filter to either the SFR2/SFR4 switch or the SFR3/SFR4 switch.

FIG. 8 is an illustration of an embodiment of an FECC 800 in which an additional SP2T isolation switch 802 is provided to selectively couple the SFR4 filter to either the SFR2/SFR4 switch or the SFR3/SFR4 switch. It can be seen from FIG. 5, which shows the FECC 400 operating in a mode in which a CA signal has both SFR3 and SFR4 signals, that the signal from the SFR4 filter 418 is coupled to the input of the SFR3/SFR4/SFR5 switch 406 and to the input of the SFR6/SFR7/SFR4 switch 412. Therefore, a capacitive load from the deselected input of the SFR3/SFR4/SFR5 switch 406 will be directly coupled to the input of the active LNA 404. The isolation switch 802 allows the output of the SFR4 filter 418 to be selectively directed to either the SFR3/SFR4 switch 210 or SFR2/SFR4 switch 209, reducing the capacitive load of the two off switches 426, 424 (see FIG. 5) from the input of the LNA 404.

Figure 9:
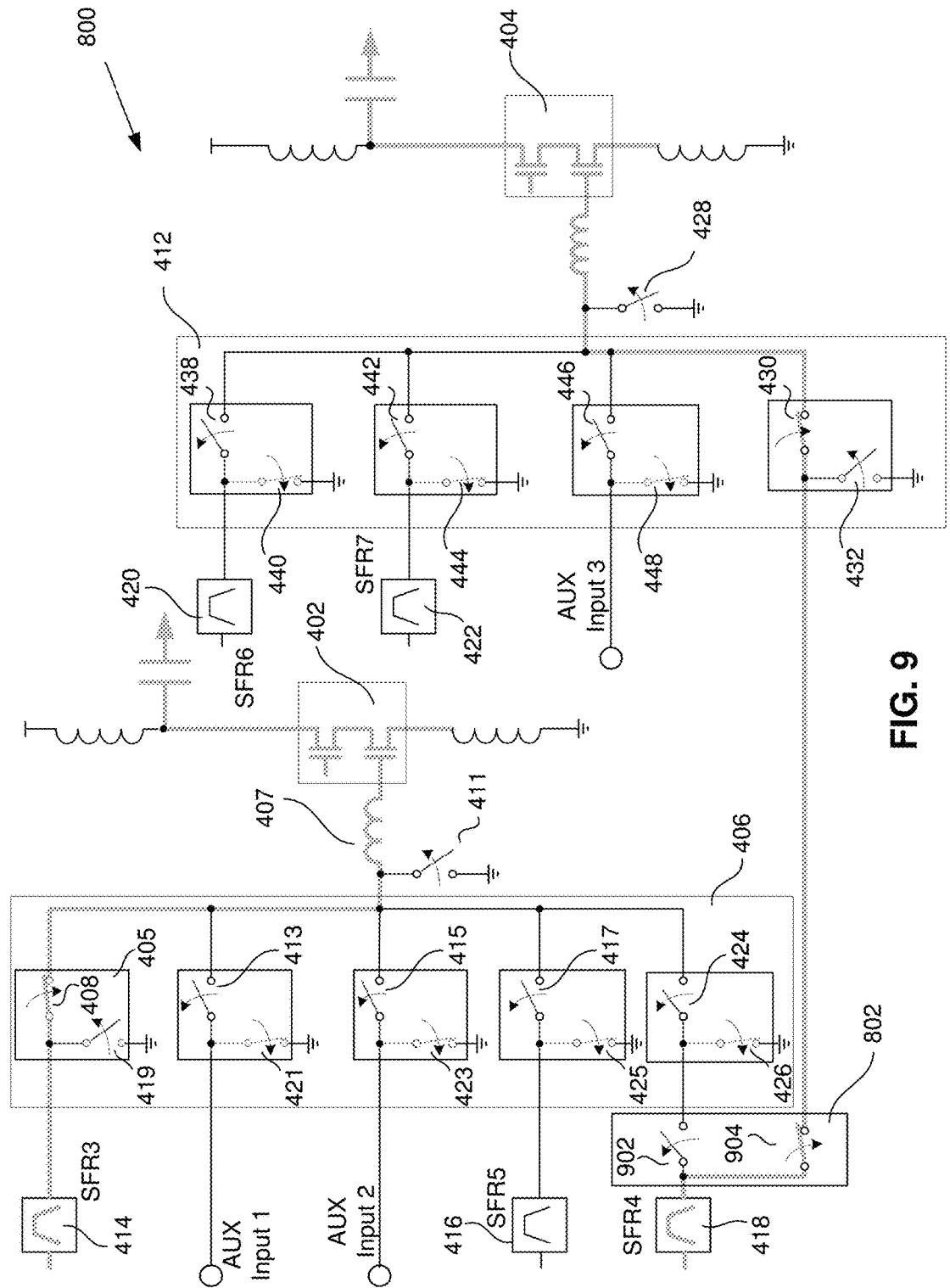
FIG. 9 is a simplified schematic of some portions of an FECC with the additional switch of FIG. 8.

FIG. 9 is a simplified schematic of some portions of an FECC 800 with the additional isolation switch 802. The FECC 800 is in the switch configuration assumed for reception of a CA signal in which an SFR3 signal is aggregated with an SFR4 signal. It can further be seen that a switch 902 within the SP2T isolation switch 802 is open to isolate the SFR4 filter 418 from the SFR3/SFR4/SFR5 switch 406. Switch 904 within the SP2T isolation switch 802 is closed to provide a path between the SFR4 filter 418 and the SFR6/SFR7/SFR4 switch 412. Providing the additional isolation switch 802 increases the isolation between the SFR4 filter 418 and the SFR6/SFR7/SFR4 switch 412 (and thus, the LNA 402). The shunt switch 426 further assists in isolating the input of the LNA 402. However, the additional isolation comes at the cost of an increase in the noise figure for SFR4 signals amplified by the LNAs 402, 404.

Figure 10:
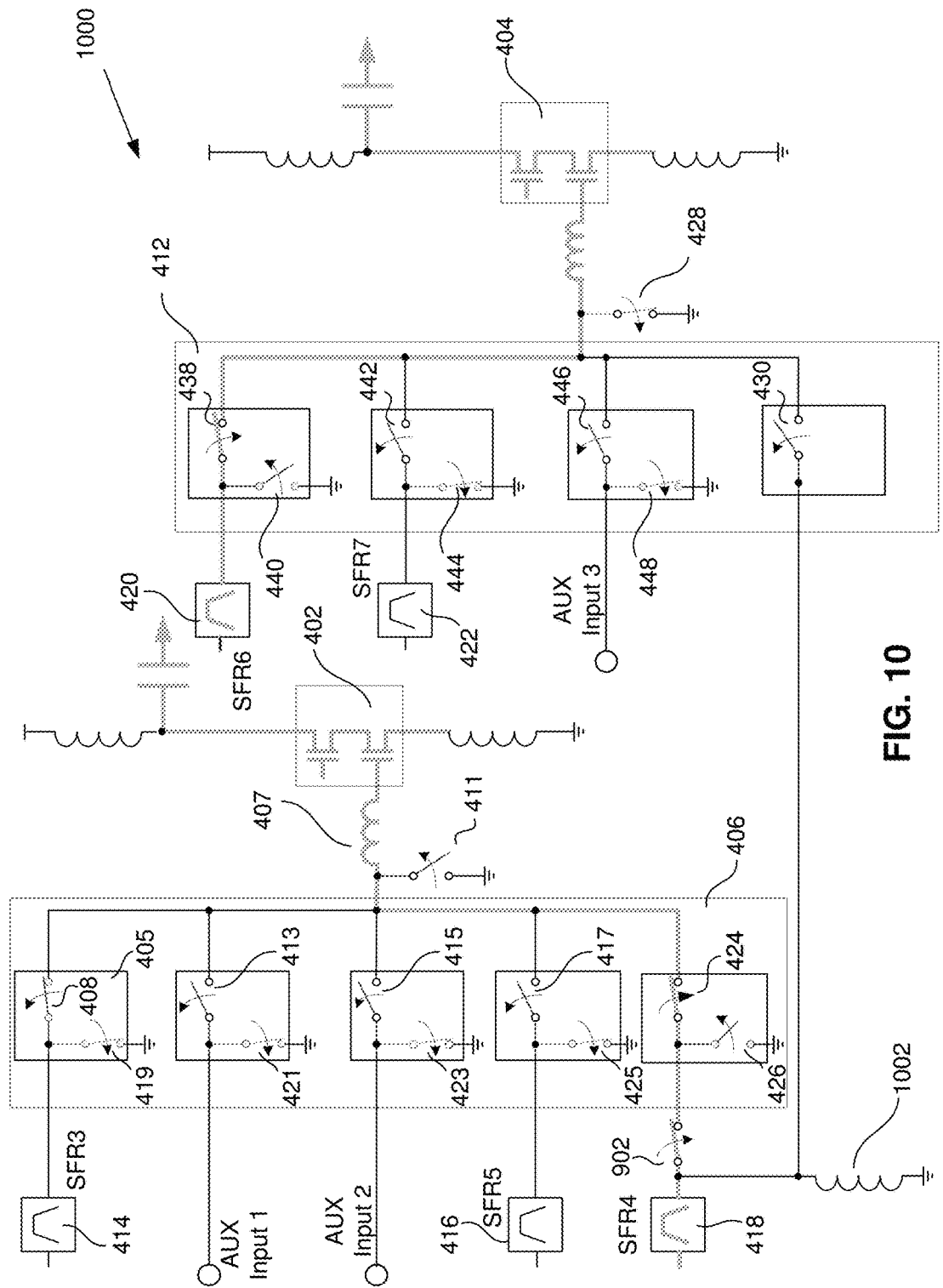
FIG. 10 is a simplified schematic of an FECC in which a shunt inductance is provided at the output of a SFR4 filter to compensate for the additional capacitance that is added to the load at the input of the LNA by the pair of open switches of a SFR2/SFR4 switch.

FIG. 10 is a simplified schematic of an FECC 1000 in which a shunt inductance 1002 is provided at the output of the SFR4 filter 418. In the FECC 1000, a SPST switch 902 provides isolation between the SFR4 filter 418 and the LNA 402. The output of the SFR4 filter 418 is also directly connected to the input of the SFR6/SFR7/SFR4 switch 412. Therefore, to compensate for the additional capacitance that is added to the load at the input of the LNA 402 by the open switch 430 of the SFR6/SFR7/SFR4 switch 412 the shunt inductance 1002 is provided. Accordingly, the impedance match at the input of the LNA 402 can be maintained when the SFR4 filter 418 is coupled to either the input of the LNA 402 or the LNA 404. In most embodiments, the inductor 1002 can be integrated into the filter 418.

Methods

Figure 11:
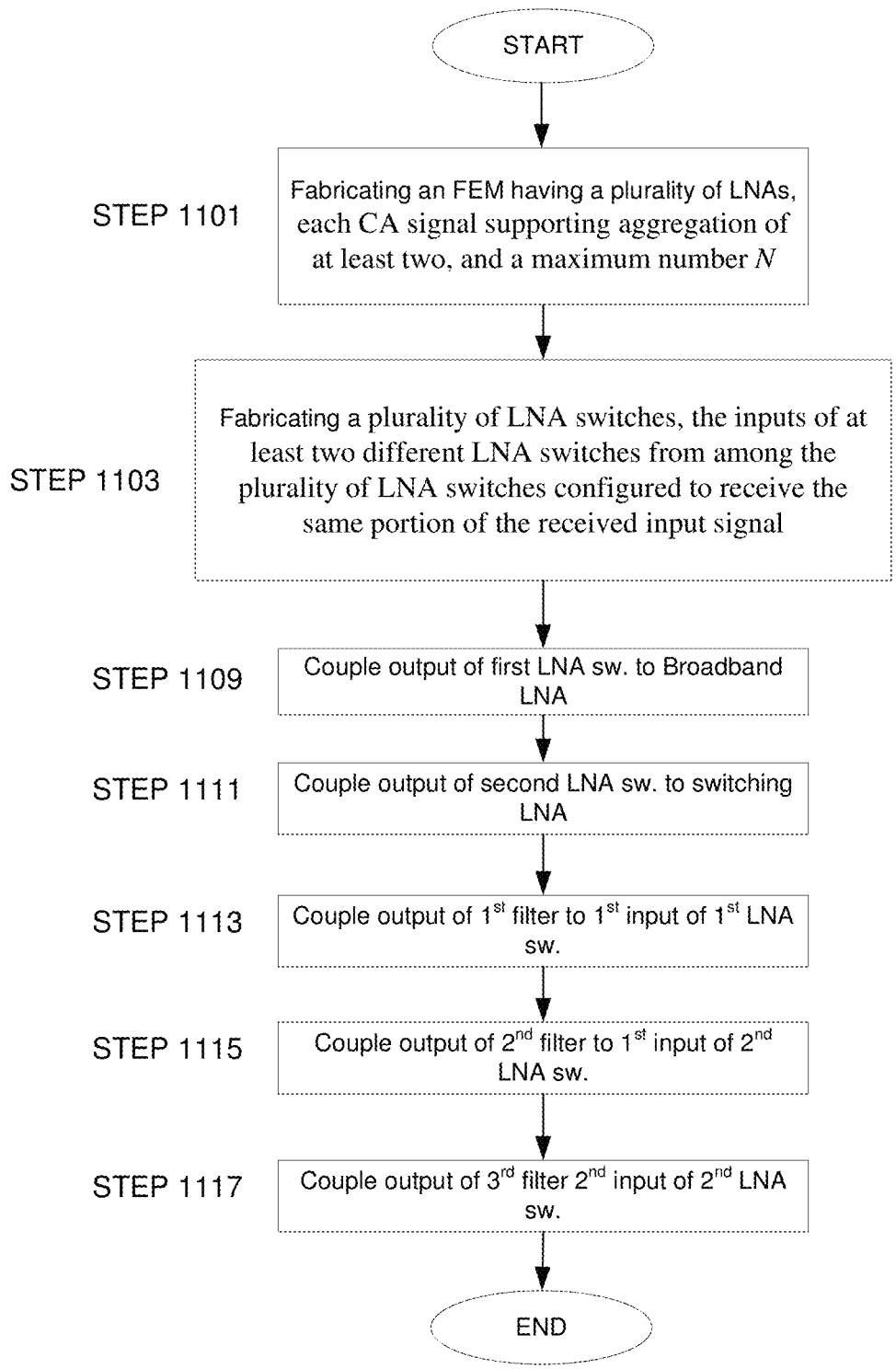
FIG. 11 is an illustration of a method in accordance with one embodiment for fabricating an LNA having at least one broadband LNA and at least one band-switching LNA.

FIG. 11 is an illustration of a method in accordance with one embodiment for fabricating an FECC. The FECC is fabricated to have a plurality of LNAs (STEP 1101). The LNAs are configured to amplify carrier aggregation (CA) signals. Each CA signal supports aggregation of at least two, and a maximum number N supported frequency ranges selected from a set of supported frequency ranges that is greater than N. Each LNA has an operating frequency range that includes at least one from among the set of supported frequency ranges. The number of LNAs is equal to N. Each of the supported frequency ranges of the set of supported frequency ranges is within the operating range of at least one LNA. A plurality of LNA switches is also fabricated (STEP 1103). Each LNA switch has a plurality of inputs. Each input is configured to receive at least a portion of a received input CA signal. At least a portion of the received input signal coupled to each input has a frequency within at least one of the supported frequency ranges. The inputs of at least two different LNA switches from among the plurality of LNA switches are configured to receive the same portion of the received input signal. Each LNA switch is fabricated to have an output coupled to a corresponding one of the plurality of LNAs, such that there is a one to one relationship between the LNAs and LNA switches.

The output of the first LNA switch is coupled to the input of the broadband LNA (STEP 1109) The output of the second LNA switch is coupled to the input of the switching LNA (STEP 1111). The output of the first filter is coupled to a first input of the first LNA switch (STEP 1113). The output of the second filter is coupled to a first input of the second LNA switch (STEP 1115). The output of the third filter is coupled to a second input of the first LNA switch and a second input of the second LNA switch (STEP 1117).

Fabricating the FECC in this manner provides an FECC in which two LNAs can be used to amplify any combination of two supported frequency ranges, each supported frequency range having a unique frequency, wherein at least one frequency is within the first frequency range and the other is either within the first frequency range or within the second frequency range.

Fabrication Technologies and Options

As should be readily apparent to one of ordinary skill in the art, various embodiments of the claimed invention can be implemented to meet a wide variety of specifications. Unless otherwise noted above, selection of suitable component values is a matter of design choice and various embodiments of the claimed invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, in some cases, the inventive concepts claimed may be particularly useful with an SOI-based fabrication process (including SOS), and with fabrication processes having similar characteristics.

Circuits and devices in accordance with the above disclosed method and apparatus may be used alone or in combination with other components, circuits, and devices. Embodiments of the disclosed method and apparatus may be fabricated as integrated circuits (ICs), which may be encased in IC packages and/or or modules for ease of handling, manufacture, and/or improved performance.

Embodiments of the disclosed method and apparatus are useful in a wide variety of receivers. Such receivers are useful in a variety of applications, such as radar systems (including phased array and automotive radar systems), radio systems (including cellular radio systems), and test equipment. Such circuits may be useful in systems operating over some or all of the RF range (e.g., from around 20 kHz to about 300 GHz).

Radio systems include both wired and wireless RF systems (including base stations, network components, relay stations and hand-held transceivers) that use various technologies and protocols, including various types of orthogonal frequency-division multiplexing ("ODFM"), quadrature amplitude modulation ("QAM"), Code Division Multiple Access ("CDMA"), Wide Band Code Division Multiple Access ("W-CDMA"), Fifth Generation ("5G"), 5G New Radio ("NR"), Global System for Mobile Communications ("GSM"), Enhanced Data Rates for GSM Evolution (EDGE), Long Term Evolution ("LTE"), Multimedia over Coaxial Alliance ("MOCA"), WiFi, as well as other wired and wireless communication standards and protocols.

Figure 12:
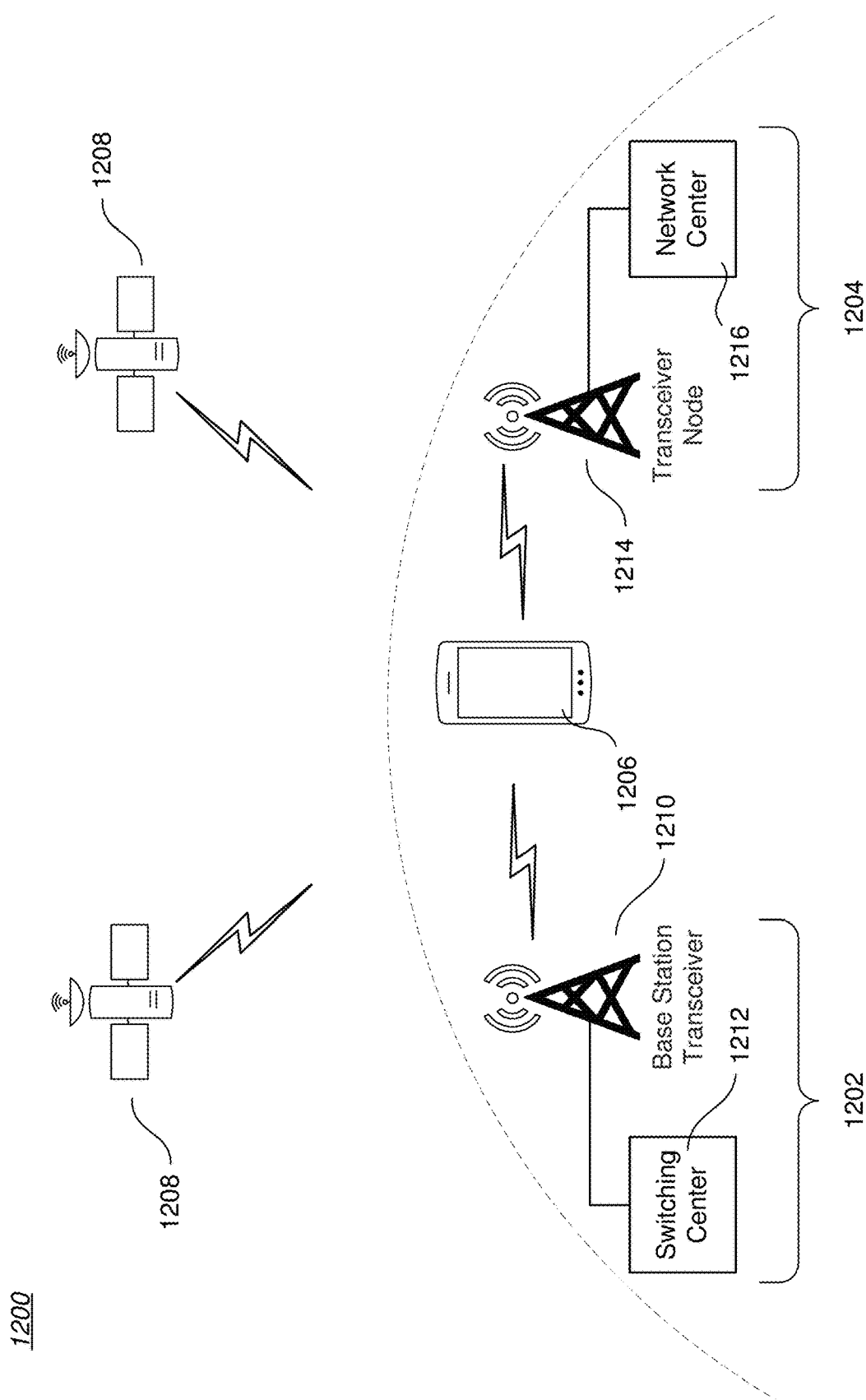
FIG. 12 is an illustration of an example of an environment comprising different wireless communication systems.

FIG. 12 is an illustration of an example of an environment comprising different wireless communication systems 1202 and 1204. As will be seen below, receivers in each of the components of the system 1200 may include the FECC 200, 201, 400, 800, 1000 described above.

The environment may include one or more mobile wireless devices 1206. In some embodiments, the wireless device 1206 is capable of communicating with multiple wireless communication systems 1202, 1204 using one or more of the telecommunication protocols noted above. In some embodiments, the wireless device 1206 is also/alternatively capable of communicating with one or more satellites 1208, such as navigation satellites (e.g., GPS) and/or telecommunication satellites. The wireless device 1206 may be equipped with multiple antennas, externally and/or internally, for operation on different frequencies and/or to provide diversity against deleterious path effects, such as fading and multi-path interference. The wireless device 1206 may be a cellular phone, personal digital assistant (PDA), wireless-enabled computer or tablet, or other wireless communication unit or device. In some embodiments, the wireless device 1206 may be referred to as a mobile station, user equipment, access terminal, or by other terminology.

In some embodiments, the wireless system 1202 is a CDMA-based system that includes one or more base station transceivers (BSTs) 1210 and at least one switching center (SC) 1212. Each BST 1210 provides over-the-air RF communication for wireless devices 1206 within its coverage area. The SC 1212 couples to one or more BSTs in the wireless system 1202 and provides coordination and control for those BSTs.

The wireless system 1204 may be, for example, a TDMA-based system that includes one or more transceiver nodes 1214 and a network controller (NC) 1216. Each transceiver node 1214 provides over-the-air RF communication for wireless devices 1206 within its coverage area. The NC 1216 couples to one or more transceiver nodes 1214 in the wireless system 1204 and provides coordination and control for those transceiver nodes 1214.

In general, each BST 1210 and transceiver node 1214 is a fixed station that provides communication coverage for wireless devices 1206, and may also be referred to as base stations or some other terminology. The SC 1212 and the RC 1216 are network entities that provide coordination and control for the base stations and may also be referred to by other terminologies.

Figure 13:
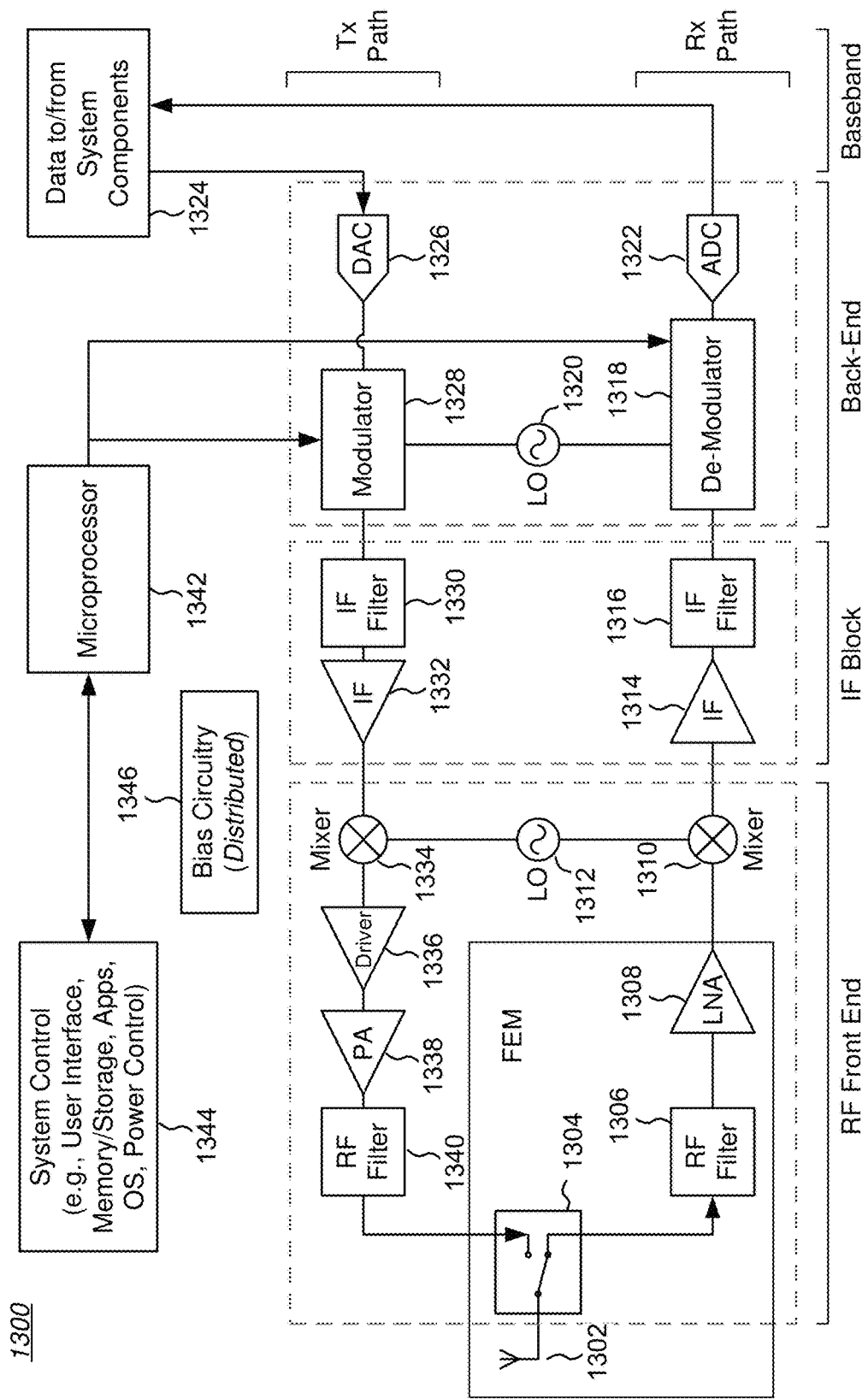
FIG. 13 is a block diagram of a transceiver that might be used in a wireless device.

FIG. 13 is a block diagram of a transceiver 1300 that might be used in a wireless device 1310, such as the wireless device 1206. As illustrated, the transceiver 1300 includes RF circuitry for directly conveying and/or transforming signals. In addition, circuitry is shown outside of the RF signal path for providing support functionality to the RF circuitry (e.g., for bias voltages and switching signals). Still further, digital circuitry is shown for providing control and user interface functionality. In this example, a receiver (RX) path includes an RF Front End, an IF Block, Back-End, and a Baseband section. In some implementations, the differentiation between portions of the RX path may be different that described herein.

The RX path receives signals through an antenna 1302. The antenna 1302 provides received signals 205 to a switching unit 1304. The switching unit 1304 may be implemented with active switching devices (e.g., field effect transistors or FETs) or with passive devices. In some embodiments, the switching unit 1304 may be a diplexer or duplexer implementing frequency domain multiplexing. An RF filter 1306 passes desired received RF signals to the RF front end (RFFE) amplifier 200. The output of the RFFE amplifier 200 coupled to a mixer 1310. A first local oscillator 1312 is also coupled to the mixer 1310 to downconvert the front end amplifier output to an intermediate frequency (IF) signal. In some embodiments, the IF signal is amplified by an IF amplifier 1314. The output of the IF amplifier 1314 is coupled to an IF filter 1316, the output of which is coupled to the input of a demodulator 1318. In some embodiments, the demodulator 1318 is coupled to a second local oscillator 1320. The demodulated output of the demodulator 1318 is converted to a digital signal by an analog-to-digital converter (DAC) 1322. The output of the DAC 1322 is provided to one or more system components 1324 (e.g., a video graphics circuit, a sound circuit, memory devices, etc.). In some such embodiments, the converted digital signal represents video, still images, sounds or symbols (such as text or other characters).

In the illustrated system 1300, a transmitter (TX) path includes a Baseband section, a Back-End, an IF Block, and a RF Front End. Similar to the RX path, in some implementations, the differentiation between the designated portions of the RX path may be different. Digital data from one or more system components 1324 is converted to an analog signal by a digital-to-analog converter (ADC) 1326. The output of the ADC 1326 is applied to a modulator 1328. In some embodiments, the second local oscillator 1320 is coupled to the modulator 1328 to modulate the analog signal. The modulated analog signal is coupled to an IF filter 1330. The output of the filter 1330 is then amplified by an IF amplifier 1332. The output of the IF amplifier 1332 is upconverted to an RF signal in a mixer 1334 to which the output of the first local oscillator 1312 is coupled. The RF signal may be amplified by a driver 1336. The output of the driver 1336 is applied to a power amplifier (PA) 1338. In some embodiments, the amplified RF signal is coupled to an RF filter 1340. The output of the filter 1340 transmitted by the antenna 1302, which receives the signal via the switching unit 1304.

In some embodiments, the operation of the transceiver 1300 is controlled by a microprocessor 1342 in known fashion. In particular, the microprocessor 1342 is coupled to, and controls the functions of, system control components. Such system control components include such things as user interfaces, memory/storage devices, application programs, operating system software, power control, etc. In addition, the transceiver 1300 may include other circuitry, such as bias circuitry 1346 (which may be distributed throughout the transceiver 1300 in proximity to transistor devices), electrostatic discharge (ESD) protection circuits, testing circuits (not shown), factory programming interfaces (not shown), etc.

In modern transceivers, there are may be more than one RX path and TX path. For example, separate paths may be provided to accommodate multiple frequencies and/or signaling modalities. Further, as should be apparent to one of ordinary skill in the art, some components of the transceiver 1300 may be in a positioned in a different order (e.g., filters). Other components can be added, such as additional filters, impedance matching networks, variable phase shifters/attenuators, power dividers, etc.

In some embodiments, the FECC shown in FIG. 13, which includes the LNA 1308, RF filter 1306 and switching unit 1304 may be the FECC 200, 201, 400, 800, 1000 described above.

A number of embodiments of the claimed invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the claimed invention, which is defined by the scope of the following claims, and that other embodiments are within the scope of the claims.

What is claimed is:

1. A front end circuit configuration (FECC) configured to receive input signals, some of which are Carrier Aggregated (CA) signals, each CA signal supporting aggregation of at least two, and a maximum number N, supported frequency ranges selected from a set of supported frequency ranges that is greater than N, the FECC including:

(a) a plurality of Low Noise Amplifiers (LNAs) used for amplifying the CA signals, each LNA having an operating frequency range that includes at least one from among the set of supported frequency ranges, the number of LNAs used for amplifying CA signals being equal to N, each of the supported frequency ranges of the set of supported frequency ranges being within the operating range of at least one LNA; and (b) a plurality of LNA switches, each LNA switch having a plurality of inputs, each input configured to receive at least a portion of the received input signal, the at least a portion of the received input signal having a frequency within at least one of the supported frequency ranges, the inputs of at least two different LNA switches from among the plurality of LNA switches receiving the same at least a portion of the received input signal and each LNA switch having an output coupled to a corresponding one of the plurality of LNAs such that there is a one to one relationship between the LNAs and LNA switches.

2. The FECC of claim 1, further comprising a plurality of filters configured to receive the received input signal and pass a portion of the received input signal having a frequency within one of the supported frequency ranges.

3. The FECC of claim 2, wherein at least one of the LNAs is a band-switching LNA having a first mode of operation in which the LNA has a first operating frequency range and a second mode of operation in which the LNA has a second operating frequency range.

4. The FECC of claim 3, wherein at least one LNA is a broadband LNA having an operating frequency range that includes at least two supported frequency ranges.

5. The FECC of claim 4, wherein one of the at least two supported frequency ranges is common with the operating frequency range of the band-switching LNA when operating in the first mode of operation and a second of which is outside the operating frequency range of the band-switching LNA when operating in both the first and the second mode of operation.

6. The FECC of claim 2, wherein at least a first of the plurality of filters is tuned to the common supported frequency range and further including at least one isolation switch having an input coupled to the first filter.

7. The FECC of claim 2, further including a shunt switch coupled between ground and an input of at least one LNA from among the plurality of LNAs, the at least one LNA having an operating frequency range that includes at least two supported frequency ranges.

8. The FECC of claim 2, wherein at least a first of the plurality of filters is tuned to the common supported frequency range and further including an inductance coupled between ground and the first filter.

9. The FECC of claim 2, further comprising:
(a) an input switch configured to receive the received CA signal, the input switch having a plurality of outputs, each output coupled to a subset of the filters; and (b) a switch control processor coupled to input switch and to each of the plurality of LNA switches, the switch control processor coordinating the operation of the input switch to the operation of the plurality of LNA switches.

10. The FECC of claim 1, wherein there are four supported frequency ranges and three LNAs.

11. The FECC of claim 1, wherein the band switching LNA operates in the first mode when the first LNA switch selects the first input.

12. The FECC of claim 11, wherein the band switching LNA operates in the second mode when the second LNA switch selects the second input.

13. A method for fabricating an FECC, comprising:
(a) fabricating an FECC having a plurality of Low Noise Amplifiers (LNAs) configured to amplify carrier aggregation (CA) signals, each CA signal supporting aggregation of at least two, and a maximum number N, supported frequency ranges selected from a set of supported frequency ranges that is greater than N, each LNA having an operating frequency range that includes at least one from among the set of supported frequency ranges, the number of LNAs being equal to N, each of the supported frequency ranges of the set of supported frequency ranges being within the operating range of at least one LNA; and
(b) fabricating a plurality of LNA switches, each LNA switch having a plurality of inputs, each input configured to receive at least a portion of the received input signal, the at least a portion of the received input signal having a frequency within at least one of the supported frequency ranges, the inputs of at least two different LNA switches from among the plurality of LNA switches configured to receive the same at least a portion of the received input signal and each LNA switch fabricated to have an output coupled to a corresponding one of the plurality of LNAs such that there is a one to one relationship between the LNAs and LNA switches.

* * * * *